(12) United States Patent
Chen et al.

(10) Patent No.: US 11,966,124 B2
(45) Date of Patent: Apr. 23, 2024

(54) DISPLAY PANEL AND DISPLAY DEVICE WITH PARTICULAR ARRANGEMENT OF SPACERS IN A PHOTOELECTRIC SENSING REGION

(71) Applicant: BOE TECHNOLOGY GROUP CO., LTD., Beijing (CN)

(72) Inventors: Kai Chen, Beijing (CN); Yanqing Chen, Beijing (CN); Ruichao Liu, Beijing (CN); Jie Tong, Beijing (CN); Xiaofeng Zhang, Beijing (CN); Weida Qin, Beijing (CN); Ning Wang, Beijing (CN); Yan Wang, Beijing (CN); Wei Li, Beijing (CN); Haoyi Xin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 380 days.

(21) Appl. No.: 17/417,424

(22) PCT Filed: Dec. 30, 2020

(86) PCT No.: PCT/CN2020/141413
§ 371 (c)(1),
(2) Date: Jun. 23, 2021

(87) PCT Pub. No.: WO2021/196784
PCT Pub. Date: Oct. 7, 2021

(65) Prior Publication Data
US 2022/0334424 A1    Oct. 20, 2022

(30) Foreign Application Priority Data
Mar. 31, 2020    (CN) .......................... 202010243978.6

(51) Int. Cl.
*G02F 1/1339* (2006.01)
*G02F 1/1333* (2006.01)
*G02F 1/1335* (2006.01)

(52) U.S. Cl.
CPC ...... *G02F 1/13394* (2013.01); *G02F 1/13338* (2013.01); *G02F 1/133512* (2013.01); *G02F 1/133514* (2013.01); *G02F 1/13396* (2021.01)

(58) Field of Classification Search
CPC .......... G02F 1/13394; G02F 1/133512; H04N 23/57
See application file for complete search history.

(56) References Cited

U.S. PATENT DOCUMENTS

| | | |
|---|---|---|
| 8,717,513 B2 | 5/2014 | Park et al. |
| 10,890,794 B2 | 1/2021 | Tien et al. |
| 2020/0103690 A1* | 4/2020 | Wu ..................... G02F 1/13394 |

FOREIGN PATENT DOCUMENTS

| | | |
|---|---|---|
| CN | 102841457 A | 12/2012 |
| CN | 108919545 A | 11/2018 |

(Continued)

OTHER PUBLICATIONS

International Search Report for corresponding International Application No. PCT/CN2020/141413, dated Mar. 25, 2021. 13 pages.

*Primary Examiner* — Jessica M Merlin
(74) *Attorney, Agent, or Firm* — Leason Ellis LLP

(57) ABSTRACT

A display panel includes a display region and a photoelectric sensing region which includes a light transmitting region and a frame region surrounding the light transmitting region; the frame region includes a first region surrounding the light transmitting region, a second region on a side of the first region away from the light transmitting region and surrounding the first region, and a third region between the second region and the display region. The spacers are in an array and in the display region but not in the light transmitting (Continued)

region. A plurality of first support pillars are in the first region, arranged around the light transmitting region, and spaced from each other. A plurality of second support pillars are in the second region, around the second region, and spaced from each other. A plurality of third support pillars are in the third region in an array.

20 Claims, 13 Drawing Sheets

(56) References Cited

FOREIGN PATENT DOCUMENTS

| | | | | | |
|---|---|---|---|---|---|
| CN | 109143648 | A | | 1/2019 | |
| CN | 209356818 | U | | 9/2019 | |
| CN | 110515243 | A | * | 11/2019 | ........... G02F 1/1333 |
| CN | 110515243 | A | | 11/2019 | |
| CN | 110618549 | A | | 12/2019 | |
| CN | 211826807 | A | | 10/2020 | |
| JP | 2015022195 | A | | 2/2015 | |

* cited by examiner

DISPLAY PANEL AND DISPLAY DEVICE WITH PARTICULAR ARRANGEMENT OF SPACERS IN A PHOTOELECTRIC SENSING REGION

CROSS-REFERENCE TO RELATED PATENT APPLICATIONS

This application is a U.S. National Stage Application under 35 U.S.C. § 371 of International Patent Application No. PCT/CN2020/141413, filed Dec. 30, 2020, which claims priority to Chinese patent application No. 202010243978.6, filed on Mar. 31, 2020, both of which are incorporated herein by reference in their entireties as part of the present application.

TECHNICAL FIELD

At least an embodiment of the present disclosure relates to a display panel and a display device.

BACKGROUND

In general, the display devices (e.g., mobile phones, tablet PC, etc.) comprise photoelectric sensing devices, such as, an image capturing device or a fingerprint recognition device, which is usually disposed on a side outside the display region of the display screen. However, it is no conductive to a full design of display screen with narrow bezel because the installation of the image capturing device needs a certain area. For example, the image capturing device can be combined with the display region of the display screen, and a place can be reserved in the display region for the image capturing device (e.g., a front image capturing device) to maximize the display region of the display screen. To ensure the intensity of the signals received by the devices, the place reserved for the image capturing device needs to have a high transmittance. To ensure the imaging effect of the image capturing device, the place reserved for the image capturing device also needs to have good homogeneity.

SUMMARY

An embodiment of the present disclosure provides a display panel comprising: a display region and a photoelectric sensing region, a plurality of spacer, a plurality of first support pillars, a plurality of second support pillars, and a plurality of third support pillars. The display region is located outside the photoelectric sensing region, the display region comprises a plurality of pixels arranged in an array, and each pixel of the plurality of the pixels comprises a plurality of color sub-pixels; and the photoelectric sensing region comprises a light transmitting region and a frame area surrounding the light transmitting region, and the frame region comprises: a first region, a second region, and a third region. The first region surrounds the light transmitting region. The second region is located on a side of the first region away from the light transmitting region, and surrounds the first region. The third region is located on a side of the second region away from the light transmitting region, and located between the second region and the display region to separate the second region from the display region. The plurality of the spacers are arranged in an array, and located within the display region, but not located within the light transmitting region. The plurality of the first support pillars are located within the first region, arranged around the light transmitting region, and spaced from each other. The plurality of the second support pillars are located within the second region, arranged around the second region, and spaced from each other. The plurality of the third support pillars are located within the third region, and arranged in an array.

For example, the display panel of an embodiment of the present disclosure further comprises: a first substrate; a second substrate opposite to the first substrate; a black matrix located on a side of the second substrate adjacent to the first substrate, covering the frame area, and defining the plurality of the color sub-pixels in the display region, wherein orthographic projections of the plurality of the spacers, orthographic projections of the plurality of the first support pillars, orthographic projections of the plurality of the second support pillars, and orthographic projections of the plurality of the third support pillars on the first substrate are located within an orthographic projection of the black matrix on the first substrate; and a protection layer located in the second substrate adjacent to and located on a side of the black matrix adjacent to the first substrate, covering the frame region and the display region, wherein the plurality of the spacers, the plurality of the first support pillars, the plurality of the second support pillars, and the plurality of the third support pillars are located between the first substrate and the protection layer to maintain a distance between the first substrate and the second substrate.

For example, the display panel of an embodiment of the present disclosure: a first spacer layer located in the second region and located between the black matrix and the protection layer, and the orthographic projections of the plurality of the second support pillars are located within an orthographic project of the first spacer layer on the first substrate.

For example, in the display panel of an embodiment of the present disclosure, a planar arrangement pattern of the first spacer layer is a closed ring surrounding the first region.

For example, in the display panel of an embodiment of the present disclosure, in the first region, the protection layer is directly contacted with the black matrix; the protection layer has a step configuration in the first region, the step configuration comprises a first portion away from the second region and a second portion adjacent to the second region; and in a direction vertical to the first substrate, a height of the first portion is less than a height of the second portion, and a height of the first support pillars is greater than a height of the second support pillars.

For example, in the display panel of an embodiment of the present disclosure, a planar arrangement pattern of the plurality of the first support pillars comprises at least a ring.

For example, in the display panel of an embodiment of the present disclosure, the planar arrangement pattern of the plurality of the first support pillars comprises a plurality of concentric rings; along radial directions of the concentric rings, the first support pillars in the plurality of the concentric rings are aligned with each other, or the first support pillars in adjacent concentric rings of the plurality of the concentric rings are staggered to each other.

For example, in the display panel of an embodiment of the present disclosure, a ratio of a total area of the orthographic projections of the plurality of the first support pillars on the first substrate to a total area of the orthographic projections of the plurality of the second support pillars on the first substrate is from 5 to 10.

For example, in the display panel of an embodiment of the present disclosure, a distance between centers of two adjacent the first support pillars among the plurality of the first support pillars of the same concentric ring is equal to a length or a width of a pixel in the display region.

For example, the display panel of an embodiment of the present disclosure further comprises: a second spacer layer located in the third region and located between the black matrix and the protection layer, and the orthographic projections of the plurality of the third support pillars are located within an orthographic project of the second spacer layer on the first substrate.

For example, in the display panel of an embodiment of the present disclosure, the first spacer layer and the second spacer layer are integrated, or spaced away from each other by the protection layer.

For example, the display panel of an embodiment of the present disclosure further comprises: a color film layer located on a side of the second substrate adjacent to the first substrate and comprises a first portion, a second portion and a third portion, wherein the first portion of the color film layer is located in the plurality of the color sub-pixels in the display region, and an orthographic projection of the first portion of the color film layer on the first substrate does not overlap with the orthographic projection of the black matrix on the first substrate; the second portion of the color film layer is located in the second region and configured as the first spacer layer, and an orthographic projection of the second portion of the color film layer in the first substrate overlaps with the orthographic projection of the black matrix in the first substrate; and the third portion of the color film layer is located inside the third region and configured as the second spacer layer.

For example, in the display panel of an embodiment of the present disclosure, the plurality of the spacers located in the display region comprise a plurality of primary spacers and a plurality of secondary spacers, a height of the primary spacers in the direction vertical to the first substrate is greater than a height of the secondary spacers in the direction vertical to the first substrate; a shape and size of each of the plurality of the second support pillars and a shape and size of each of the plurality of the third support pillars are identical with a shape and size of each of the plurality of the secondary spacers; and a shape and size of each of the plurality of the first support pillars are identical with a shape and size of each of the plurality of the primary spacers.

For example, the display panel of an embodiment of the present disclosure further comprise: a buffer layer located on a side of the first substrate adjacent to the second substrate and directly contacted with the first substrate; and a driving circuit layer located on a side of the buffer layer away from the first substrate and between the display region and the frame area, wherein the plurality of the spacers, the plurality of the first support pillars, the plurality of the second support pillars, and the plurality of the third support pillars are all located between the driving circuit layer and the protection layer, the driving circuit layer is not disposed in the light transmitting region, and an edge of the driving circuit layer adjacent to the light transmitting region is in the first region or on a border between the light transmitting region and the first region.

For example, in the display panel of an embodiment of the present disclosure, in the light transmitting region, a first liquid crystal layer is disposed between the buffer layer and the second substrate, and the first liquid crystal layer in in direct contact with the buffer layer.

For example, in the display panel of an embodiment of the present disclosure, in the frame region and the display region, a second liquid crystal layer is disposed between the protection layer and the driving circuit layer, a liquid crystal in the first liquid crystal layer is in communication with a liquid crystal in the second liquid crystal layer through gaps among the plurality of the first support pillars, gaps among the plurality of the second support pillar, and gaps among the plurality of the third support pillars.

For example, in the display panel of an embodiment of the present disclosure, the protection layer further covers the light transmitting region; in the light transmitting region, the protection layer is in direct contact with the second substrate, the first liquid crystal layer is located between the buffer layer and the protection layer, and is in direct contact with the protection layer.

For example, in the display panel of an embodiment of the present disclosure, no liquid crystal is disposed in the light transmitting region; in the light transmitting region, a gap between the second substrate and the buffer layer is filled with air; the display panel comprises a first sealant, and the first sealant is located between the second substrate and the buffer layer, surrounds the light transmitting region, and is in direct contact with the buffer layer and the protection layer.

For example, the display panel of an embodiment of the present disclosure further comprises a plurality of light transmitting regions, wherein two adjacent light transmitting regions comprise a first light transmitting region and a second light transmitting region, respectively; the display panel further comprises: an intermediate region located between the second region surrounding the first light transmitting region and the second surrounding the second light transmitting region; a third spacer layer arranged to be in a same layer as the first spacer layer and in connection with the first spacer layer, and comprising a first portion and a second portion, wherein the first portion and the second portion are opposed to each other in a direction, which is in a plane parallel to the first substrate, perpendicular to a direction from the first light transmitting region to the second light transmitting region, and the intermediate region is located between the first portion and the second portion; a plurality of fourth support pillars arranged along the first portion and spaced away from each other, wherein orthographic projections of the plurality of the fourth support pillars on the first substrate are located in an orthographic projection of the first portion on the first substrate; a plurality of fifth support pillars arranged along the second portion and spaced away from each other, wherein orthographic projections of the plurality of the fifth support pillar on the first substrate are located in the orthographic projections of the second portion on the first substrate; in the direction perpendicular to the first substrate, the plurality of the fourth support pillars, the plurality of the fifth support pillars and the plurality of the second support pillar are disposed in a same layer, and a shape and size of each of the plurality of the fourth support pillars are identical with a shape and size of each of the plurality of the second support pillars.

For example, the display panel of an embodiment of the present disclosure further comprises: a plurality of sixth support pillars located on a side of the first portion adjacent to the intermediate region, arranged along the first portion and spaced away from each other; and a plurality of seven support pillars located on a side of the second portion adjacent to the intermediate region, arranged alone the second portion and spaced away from each other, wherein in the direction perpendicular to the first substrate, the plurality of the sixth support pillars, the plurality of the seven support pillars and the plurality of the first support pillars are disposed in a same layer, a shape and size of each of the plurality of the sixth support pillars and a shape and size of each of the plurality of the seven support pillars are identical with a shape and size of each of the first support pillars.

For example, in the display panel of an embodiment of the present disclosure, planar shapes of the first portion and the second portion are both linear sections which are parallel to each other.

For example, in the display panel of an embodiment of the present disclosure, the black matrix covers the intermediate region, and a structure of the intermediate region is identical with a structure of the third region.

For example, in the display panel of an embodiment of the present disclosure, the intermediate region is an intermediate display region, the intermediate display region comprises a plurality of intermediate pixels arranged in an array, each of the plurality of the intermediate pixels comprises a plurality of color intermediate sub-pixels, the black matrix defines the color intermediate sub-pixels in the intermediate display region, wherein a light transmittance of the intermediate display region is less than or equal to a light transmittance of the display region.

For example, in the display panel of an embodiment of the present disclosure, the protection layer further covers the intermediate display region; a thickness of a portion of the protection layer covering the intermediate display region in a direction perpendicular to the first substrate is greater than a thickness of a portion of the protection layer covering the display region in a direction perpendicular to the first substrate.

For example, the display panel of an embodiment of the present disclosure further comprises: a plurality of intermediate spacers located in the intermediate display region and arranged in an array, wherein a structure of the plurality of the intermediate spacers is identical with a structure of the plurality of the spacers in the display region.

For example, the display panel of an embodiment of the present disclosure further comprises: a plurality of intermediate spacers located in the intermediate display region and arranged in an array, wherein an arrangement density of the plurality of the intermediate spacers in the intermediate display region is less than an arrangement density of the plurality of the spacers in the display region.

For example, in the display panel of an embodiment of the present disclosure, the photoelectric sensing region comprises at least three light transmitting regions and an auxiliary functional region, the at least three light transmitting regions and the auxiliary functional region are arranged in a 2×2 matrix, an interval between a first row and a second row of the 2×2 matrix and an interval between a first column and a second column of the 2×2 matrix form a cross region, a structure in the cross region is identical with a structure in the intermediate region.

For example, in the display panel of an embodiment of the present disclosure, the display panel is a liquid crystal display panel, the first substrate is an array substrate, and the second substrate is a color film substrate; or the display panel is an organic light-transmitting diode (OLED) display panel, the first substrate is an array substrate, and the second substrate is a package cover plate.

Another embodiment of the present disclosure provides a display device comprising any one of the above described display panels.

For example, in the display device of an embodiment of the present disclosure, a side of the second substrate away from the first substrate is a display side; the display device further comprises: a photoelectric sensing device located in the light transmitting region and on a side of the first substrate away from the second substrate, and configured to receive light from the display side.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
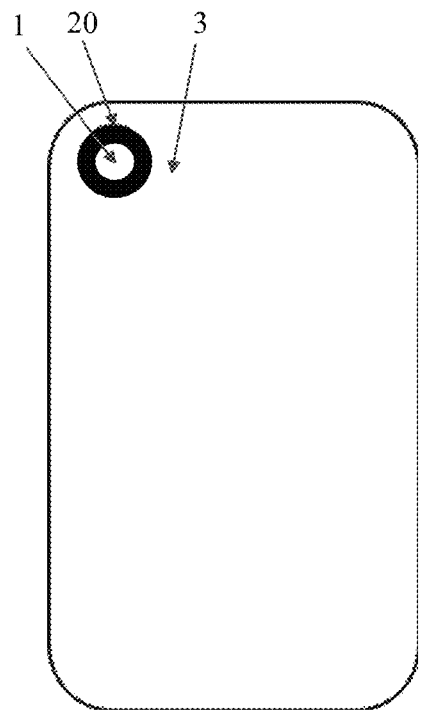
FIG. 1A is an overall schematic planar view of a display panel provided in an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The drawings in the present disclosure are not strictly drawn according to the actual scale, and the number of various supporting columns is not limited to the number as shown in the drawings. The specific size and number of various structures can be determined according to the actual requirements. The drawings in the present disclosure are merely a schematic structural view.

In a display panel (e.g., a liquid crystal panel) equipped with a photoelectric sensing device (e.g., an image capturing device or a fingerprint recognition device), the region in which the image capturing device is disposed is generally configured to have spacers between an array substrate and a color film substrate to maintain the cell thickness in the region and the structural stability to improve the uniformity of the region during use, thereby facilitating to ensure a good imaging effect of the image capturing device. However, such spacers will prevent light from passing through the region to arrive at the photoelectric sensing device, so that the region for disposing the imaging capturing device has a relatively low light transmittance. In general, the region in which the image capturing device is disposed is also configured to contain driving circuits, such as, pixel circuits, including signal lines, thin film transistors, storage capacitors, and so on.

At least an embodiment of the present disclosure provides a display panel comprising: a display region and a photoelectric sensing region, a plurality of spacer, a plurality of first support pillars, a plurality of second support pillars, and a plurality of third support pillars. The display region is located outside the photoelectric sensing region, the display region comprises a plurality of pixels arranged in an array, and each pixel of the plurality of the pixels comprises a plurality of color sub-pixels; and the photoelectric sensing region comprises a light transmitting region and a frame area surrounding the light transmitting region, and the frame region comprises: a first region, a second region, and a third region. The first region surrounds the light transmitting region. The second region is located on a side of the first region away from the light transmitting region, and surrounds the first region. The third region is located on a side of the second region away from the light transmitting region, and located between the second region and the display region to separate the second region from the display region. The plurality of the spacers are arranged in an array, and located within the display region, but not located within the light transmitting region. The plurality of the first support pillars are located within the first region, arranged around the light transmitting region, and spaced from each other. The plurality of the second support pillars are located within the second region, arranged around the second region, and spaced from each other. The plurality of the third support pillars are located within the third region, and arranged in an array.

Figure 2A:
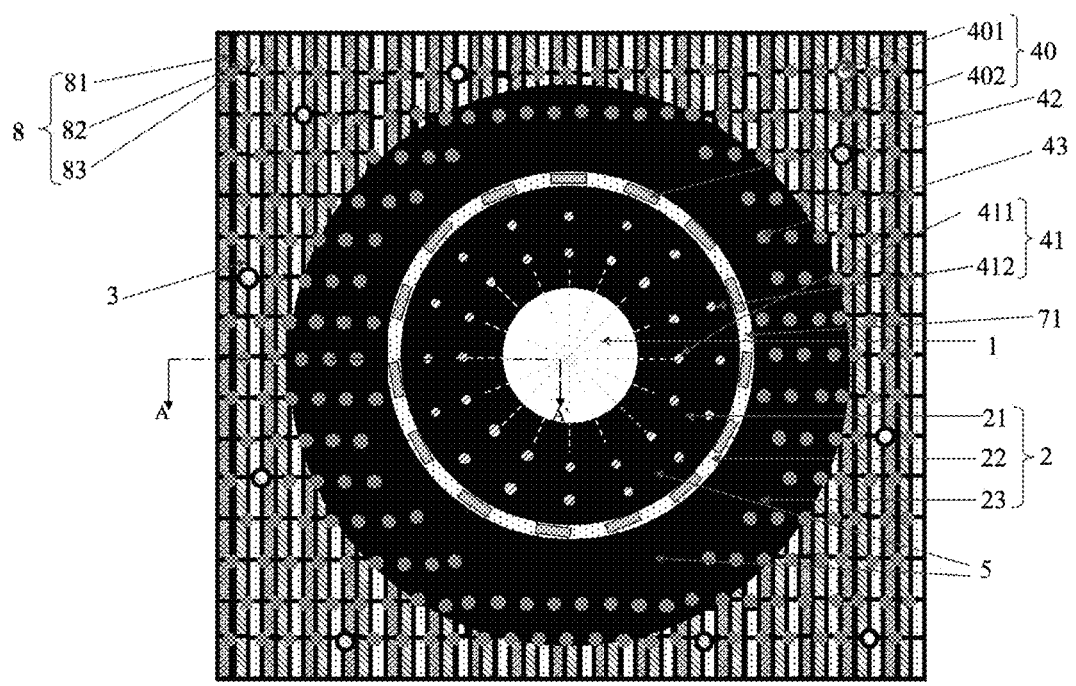
FIG. 2A is an enlarged schematic view of the photoelectric sensing region and its surrounding area as shown in FIG. 1.
Figure 2B:
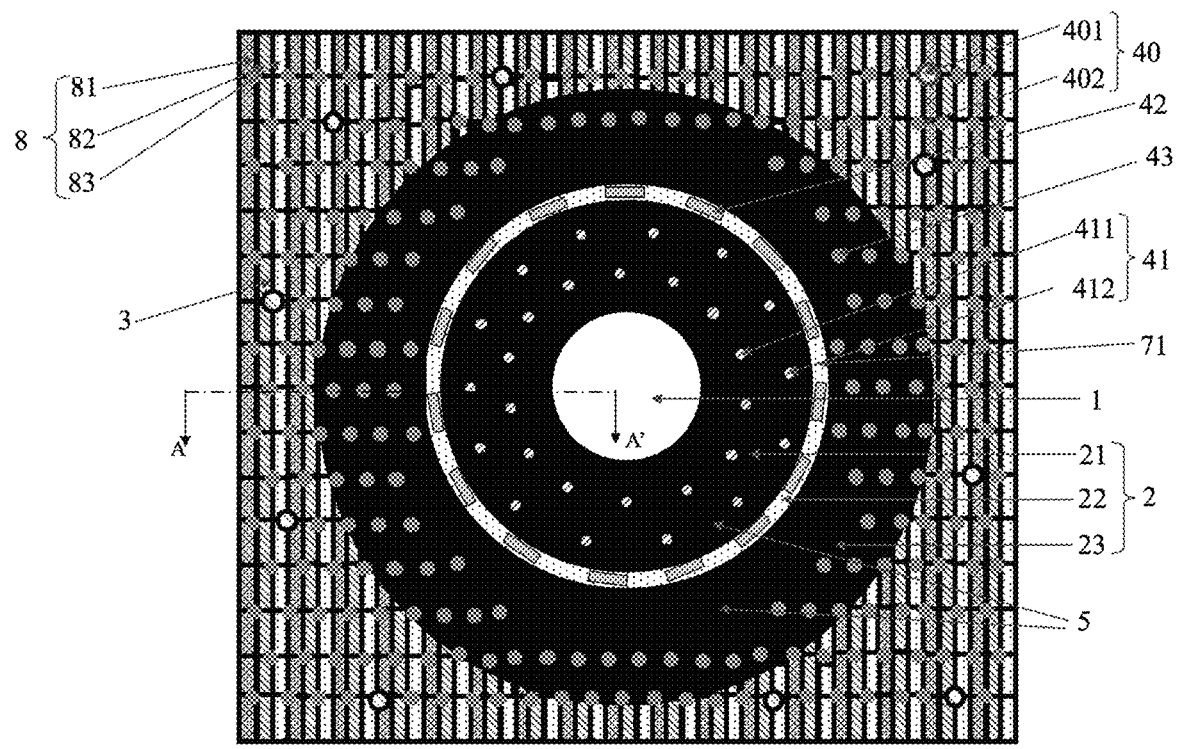
FIG. 2B is another enlarged schematic view of the photoelectric sensing region and its surrounding areas as shown in FIG. 1.

It should be noted that in the present disclosure, the number of the first support pillars 41, the number of the second support pillars 42, and the number of the support pillars 43 as shown in FIG. 3A, FIG. 3D, FIG. 4, and FIG. 5 are not completely corresponding to those in FIG. 2A and FIG. 2B. These drawings in the present disclosure are merely schematic views for representing the structural relations among various structures as described. In FIG. 2A and FIG. 2B, due to the dimension limitation, the orthographic projections of the primary spacers 401 and the secondary spacers 402 on the black matrix do not appear completely located within the black matrix. However, in fact, in an embodiment of the present disclosure, the orthographic projections of the primary spacers 401 and the secondary spacers 402 on the black matrix do not appear completely located within the black matrix. It is subject to text description of the claims and specification, while the drawings are merely to schematically illustrate the planar arrangement pattern of various structure.

Figure 1B:
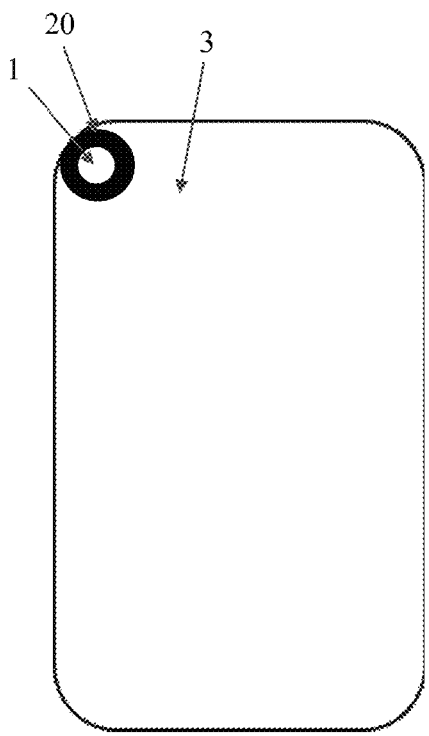
FIG. 1B is an overall schematic planar view of another display panel provided in an embodiment of the present disclosure.
Figure 1C:
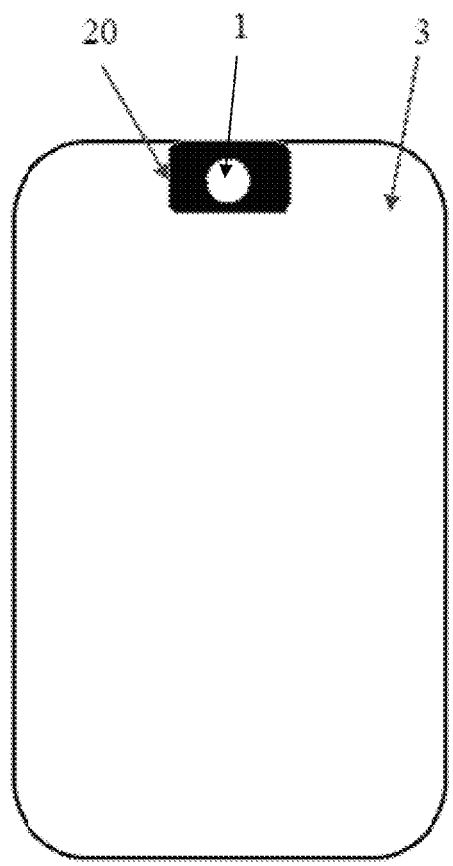
FIG. 1C is an overall schematic planar view of still another display panel provided in an embodiment of the present disclosure.
Figure 3A:
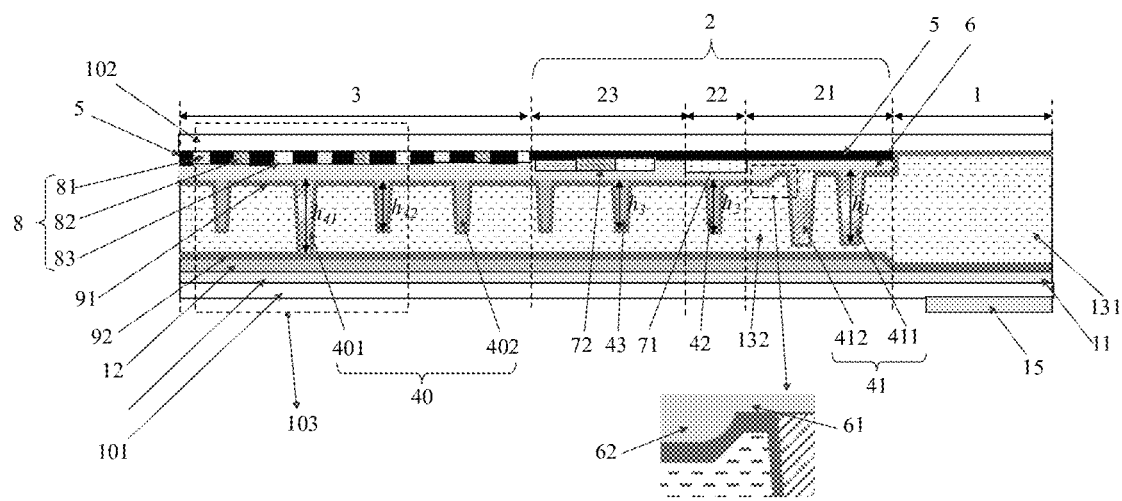
FIG. 3A is a schematic sectional view taken along the A-A' line in FIG. 2A.

As an example, FIG. 1A is an overall schematic planar view of a display panel provided in an embodiment of the present disclosure; FIG. 2A is an enlarged schematic view of the photoelectric sensing region and its surrounding areas as shown in FIG. 1A; and FIG. 3A is a sectional view taken along the A-A' line in FIG. 2A. As shown in FIG. 1A, the display panel comprises a display region 3 and a photoelectric sensing region 20. The display region 3 is located on an outer side of the photoelectric sensing region 20, e.g., the display region 3 surrounds at least a part of the photoelectric sensing region 20. For example, in the embodiment as shown in FIG. 1A, the display region 3 surrounds all of the photoelectric sensing region 20. In other embodiments, the display region 3 can also surround a part of the photoelectric sensing region 20. For instance, as shown in FIG. 1B, the photoelectric sensing region 20 is located at a top corner of the display panel, and the display region 3 also surrounds a part of the photoelectric sensing region 20. Alternatively, for instance, as shown in FIG. 1C, the photoelectric sensing region 20 is located on the edge of the display panel, and located in the middle of an edge of the outer contour of the display panel. An end of the photoelectric sensing region 20 adjacent to this edge is connected to the non-display region next to the edge, and the display region 3 surrounds a portion of the photoelectric sensing region 20 except the end of the photoelectric sensing region 20 in contact with the non-display region. The cases as shown in FIGS. 1A-1C are only exemplary, and the particular position relation between the display region 3 and the photoelectric sensing region 20 is not limited to that shown in FIGS. 1A to 1C, as long as the display region 3 surrounds at least a part of the photoelectric sensing region 20.

By reference to FIGS. 2A and 3A, the display panel comprises: a plurality of first support pillars 41, a plurality of second support pillars 42, and a plurality of third support pillars 43. The display region 3 is located at an outer side of the photoelectric sensing region 20, and comprises a plurality of pixels 8 arranged in an array. Each pixel of the plurality of the pixels 8 comprises a plurality of color sub-pixels, e.g., comprising a first sub-pixel 81, a second sub-pixel 82 and a third sub-pixel 83. For example, the first sub-pixels 81, the second sub-pixels 82 and the third sub-pixels 83 transmits red, blue, green light, respectively. The photoelectric sensing region 20 comprises a light transmitting region 1 and a frame region 2 surrounding the light transmitting region 1; the frame region 2 comprises: a first region 21, a second region 22 and a third region 23. The first region 21 surrounds the light transmitting region 1. The second region 22 is located on a side of the first region 21 away from the light transmitting region 1, that is, the second region 22 is located on an outer side of the light transmitting region 1, and surrounds the first region 21. The third region 23 is located on a side of the second region 22 away from the light transmitting region 1, and located between the second region 22 and the display region 3 to separate the second region 22 from the display region 3. The plurality of the spacers 40 are arranged in an array, and located within the display region 3, rather than located within the light transmitting region 1. The plurality of the first support pillars 41 are located within the first region 21, arranged around the light transmitting region 1, and spaced away from each other. The plurality of the second support pillars 42 are located within the second region 22, arranged around the second region 22, and spaced away from each other. The plurality of the third support pillars 43 are located within the third region 23, and arranged in an array. In the display panel, the plurality of the spacers 40 are located within the display region 3, but are not located within the light transmitting region 1, and thus the light transmittance of the light transmitting region 1 is significantly increased. Although there is no support by the spacers inside the light transmitting region 1, the plurality of the first support pillars 41 and the plurality of the second support pillars 42 located within the frame region 2 and spaced away from each other are able to maintain the stability on the periphery of the light transmitting region so as to maintain the spatial stability of the light transmitting region 1 and improve the regional stability of the light transmitting region 1, thereby increasing the light transmittance of the light transmitting region 1 and the color uniformity and stability of the light transmitted from the light transmitting region 1. Moreover, in an embodiment where liquid crystals are disposed within the first region 21, the second region 22 and the third region 2, the plurality of the first support pillars 41 are spaced away from each other and the plurality of the second support pillars 42 are spaced away from each other, so that the liquid crystal within the light transmitting region 1 can flow through the gaps among the plurality of the first support pillars 41 and the gaps among the plurality of the second support pillars 42 to ensure the flowability of the liquid crystal within the light transmitting region 1 and the liquid crystal in other regions, such as, the first region 1 and the second region 2. When an ambient temperature changes, the volume of the liquid crystal changes, and the height of the plurality of the first support pillars 41 and the height of the plurality of the second support pillars 42 change synchronously, so that the volume of the liquid crystal is matched with the cell thickness. In addition, no support pillar is disposed in the light transmitting region 1, thus maintaining the flowability of the liquid crystal can avoid any abnormal display caused by mismatch between the volume of the liquid crystal in the light transmitting region 1 and the cell thickness. Moreover, during the manufacture of the display panel, when the display panel is a liquid crystal display panel, in the step of filling the liquid crystal, it is difficult to precisely drop the liquid crystal into the light transmitting region 1 because the area of the light transmitting region 1 is very small as compared with the droplets of the added liquid crystal. Thus, the liquid crystal can be dropped into the display region 3 which has a relatively large area, and flow into the light transmitting region 1 sequentially through the second region 22 and the first region 21, as well as the gaps among the plurality of the first support pillars 41 and the gaps among the plurality of the second support pillars 42, so that the liquid crystal is filled into the light transmitting region 1. If the plurality of the first support pillars 41 or the plurality of the second support pillars 42 form a closed ring around the whole light transmitting region 1, the above-mentioned technical effect cannot be achieved. Moreover, in the third region 23, the plurality of the third support pillars 43 are also spaced away from each other. The third region 23 is located in the outer side of the first region 21 and the second region 22 (i.e., the side away from the light transmitting region) and surrounds at least a part of the light transmitting region 1. Thus, the third region 23 is closer to display region 3, e.g., adjacent to the display region 3. The display region 3 is configured to contain a plurality of spacers arranged in an array. As a result, the configuration of the plurality of the third support pillars arranged in an array in the third region 23 can allow the structure of the third region 3 adjacent to the display region 3 to become consistent with the structure of the display region 3, and allow the cell thickness to become uniform. Thus, the third region 3 can serve as a transition region from the frame region 2 and the display region 3 to allow the structure of the edge region of the display region 3 near the frame region 2 to be uniform and consistent with the structure of the intermediate area of the display region 3, thereby achieving a uniform display effect in the whole display region 3. For example, the third region 23 is a dummy region to maintain the uniformity of the edge portion of the display region 3 overlapping the photoelectric sensing region 20.

For example, the arrangement density and the array form of the plurality of the third support pillars 43 arranged in an array in the third region 23 are the same as those of the plurality of the spacers arranged in an array in the display region 3, so that the structure of the display region 3 adjacent to the third region 23 becomes consistent with the structure of the display region 3, the structure of the edge region of the display region 3 near the frame region 2 is uniform and consistent with the structure of the intermediate region of the display region 3, which is more beneficial to achieve a uniform display effect in the whole display region 3. Of course, in other embodiments, the arrangement density and the array form of the plurality of the third support pillars 43 arranged in an array in the third region 23 may be different from the arrangement density and the array form of the plurality of the spacers arranged in an array in the display region 3.

For example, the side of the second substrate 102 away from the first substrate 101 is a display side. As shown in FIG. 3A, for example, a photoelectric sensing device 15 can be disposed on a side of the first substrate 101 away from the second substrate 102, and configured to receive light from the display side, that is, the light from the display side passes through the light transmitting region into the photoelectric sensing device 15. Thus, the structure of the light transmitting region 1 can affect the magnitude of the light transmittance and the color uniformity of the transmitted light, thereby affecting the amount of the light, as well as the brightness and color uniformity of the light received by the photoelectric sensing device 15.

For example, the arrangement density of the first support pillars 41 is greater than that of the second support pillars 42, that is, the distance between the two adjacent the first support pillars 41 is less than the distance between the two adjacent the second support pillars 42 so as to provide a more stable supporting in the first region 21 that is closer to the light transmitting region 1.

For example, the arrangement density of the secondary spacers 402 in the display region 3 is 287/288, that is, the display region 3 is configured to contain 287 the secondary spacers 402 per 288 sub-pixels; and the arrangement density of the primary spacers 401 is 1/288, that is, the display region 3 is configured to contain 1 primary spacer per 288 sub-pixels. For example, the arrangement density of the third support pillars 43 within the third region 23 is the same as that of the secondary spacers 402 so that the arrangement and the cell thickness of the support pillars in the third region 23 are identical to the arrangement and the cell thickness of the spacers in the display region 3, respectively.

For example, as shown in FIG. 3, the display panel further comprises: a first substrate 101, a second substrate 102, a black matrix 5 and a protection layer 6. The second substrate 102 is opposed to the first substrate 101; the black matrix 5 is located on a side of the second substrate 102 adjacent to the first substrate 101 and covers the frame region 2, so that the frame region 2 is not light transmissive, and the black matrix 5 defines the aforesaid plurality of color sub-pixels in the display region 1; the orthographic projections of the plurality of the spacers 40, the orthographic projections of the plurality of the first support pillars 41, the orthographic projections of the plurality of the second support pillars 42, the orthographic projections of the plurality of the third support pillars 43 on the first substrate 101 are located in the orthographic projections of black matrix 5 on the first substrate 101 so as to avoid that the plurality of the spacers 40 affect the aperture ratio in the display region 3. The protection layer 6 is located in the second substrate 102 and located on a side of the black matrix 5 adjacent to the first substrate 101, and covers the frame region 2 and display region 3 to protect the plurality of the sub-pixels and the black matrix on the second substrate 102 in the frame region 2 and the display region 3. The plurality of the spacers 40, the plurality of the first support pillars 41, the plurality of the second support pillars 42, the plurality of the third support pillars 43 are located between the first substrate 101 and the protection layer 6 to maintain the cell thickness between the first substrate 101 and the second substrate 102.

For example, the display panel further comprises a first spacer layer 71 which is located in the second region 22 and between the black matrix 5 and the protection layer 6. The orthographic projections of the plurality of the second support pillars 42 on the first substrate 101 are located within the orthographic projections of the first spacer 71 on the first substrate 101. To simplify the manufacture process of the display panel, the second support pillars 42, the third support pillars 43, and the secondary spacers 402 in the display region 3 can be formed by patterning the same film layer with the same mask in one step. Thus, the height of the second support pillars 42 in the direction perpendicular to the first substrate 101, the height of the third support pillars 43 in the direction perpendicular to the first substrate 101, and the height of the secondary spacers 402 in the display region 3 are the same. In this case, the height h2 of the second support pillars in the direction perpendicular to the first substrate 101 is limited. The height h2 is superimposed with the thickness of the first spacer layer 71 in the direction perpendicular to the first substrate 101 so that each of the second support pillars 42, together with the first spacer layer 71, maintains the distance between the first substrate 101 and the second substrate 102 in the second region 22. When the second support pillars 42 are deformed by a force so as to cause a change of the height, the first spacer layer 71 can help to reduce the influence of the change on maintaining of the desired distance between the first substrate 101 and the second substrate 102 in the second region 22. Of course, if the simplification of manufacture process is not taken into consideration, the second support pillar 42 can have any height in the direction perpendicular to the first substrate 101 as required.

For example, as shown in FIG. 2A, the planar arrangement pattern of the first spacer layer 71 is a closed ring around the first region 21 to maintaining the stability of the periphery of the light transmitting region 1 at various positions around the light transmitting region 1, thereby increasing the light transmittance of the light transmitting region 1, as well as the color uniformity and stability of the light transmitted from the light transmitting region 1.

For example, as shown in FIG. 3A, in the first region 21, the protection layer 6 is in direct contact with the black matrix 6, that is, the first region 21 is not configured to comprise the first spacer layer 71 or other structure having a similar height to the first spacer layer 71, or comprise any other layer or structure present between the protection layer 6 and the black matrix 6 in the direction perpendicular to the second substrate 102. As a result, the protection layer 6 comprises a step configuration in the first region 21, and the step configuration comprises a first portion 61 away from the second region 22 and a second portion 62 adjacent to the second region 22. In the direction perpendicular to the first substrate 101, the height H1 of the first portion 61 is less than the height H2 of the second portion 62, and the height of the first support pillars 41 is greater than the height of the second support pillars 42. Because the second region 22 away from the light transmitting region 1 is configured to comprise the first spacer layer 71, while the first region 21 is not configured to comprise the first spacer layer 71, the step configuration is not located in the light transmitting region 1 so as to avoid any influence on the light transmitting uniformity of the light transmitting region 1. It should be noted that the height of the first portion 61 refers to the distance between the surface of the first portion 61 away from the second substrate 102 and the surface of the second substrate 102 facing the first substrate 101, while the height of the second portion 62 refers to the distance between the surface of the second portion 62 away from the second substrate 102 and the surface of the second substrate 102 facing the first substrate 101.

For example, the planar arrangement pattern of the plurality of the first support pillars 41 as a whole comprises at least one ring. For example, as shown in FIG. 2A, the planar arrangement pattern of the plurality of the first support pillars 41 as a whole comprises a plurality of concentric rings, e.g., two concentric rings. The number of the first support pillars 41 can be determined by comparing the dimension of the first support pillars 41 and the area of the frame region 2, so as to make a design in accordance with display panels of different sizes to achieve better supporting effect, as illustrated in details below. For example, the shape of each concentric ring is consistent with the planar shape of the light transmitting region 1 surrounded by the concentric ring so as to facilitate the plurality of the first support pillars 41 to better maintaining the stability of the periphery of the light transmitting region 1. For example, in this embodiment, the planar patterns of the light transmitting region 1 and each concentric ring are all circular. In other embodiments, when the planar shape of the light transmitting region 1 is rectangular, the shape of each concentric ring is also rectangular; and when the shape of the light transmitting region 1 is ellipsoidal, the shape of each concentric ring is also ellipsoidal. The situations as listed above are merely exemplary, and the planar shape of the light transmitting region 1 and the shape of each concentric ring is not limited in the embodiments of the present disclosure.

For example, along the radial directions of the plurality of the concentric rings, the first support pillars 41 in the plurality of the concentric rings are aligned with each other; as shown in FIG. 2A, the first support pillars 411 located in the first concentric ring near the light transmitting region 1 are aligned with the first support pillars 412 located in the second concentric ring away from light transmitting region 1 along the radial directions. Alternatively, along the plurality of the concentric rings, the first support pillars in adjacent concentric rings are staggered with each other; as shown in FIG. 2B, the first support pillars 411 located in the first concentric ring near the light transmitting region 1 are staggered with the first support pillars 412 located in the second concentric ring away from light transmitting region 1 and adjacent to the first concentric ring, that is, they are not aligned along the radial directions, so as to provide a better supporting effect; the supporting effects of the first support pillars in the adjacent concentric rings are complementary in their positions so as to provide uniform and consistent supporting effect at various positions around the light transmitting region 1, thereby better maintaining the uniformity and stability of the light transmitting region 1. Other unspecified features of the embodiment as shown in FIG. 2B are the same as those in FIG. 2A, and please refer to the description of the embodiment as shown in FIG. 2A.

For example, the ratio of the total area of the orthographic projections of the plurality of the first supporting pillars 41 on the first substrate 101 to the total area of the orthographic projections of the plurality of the second supporting pillars 42 on the first substrate 101 is from 5 to 10, which can achieve good supporting effect as demonstrated by test. For example, the ratio of the total area of the orthographic projections of the plurality of the first support pillars 41 on the first substrate 101 to the area of the frame region 2 is 0.4% to 0.6%, the ratio of the total area of the orthographic projections of the plurality of the second support pillars 42 on the first substrate 101 to the area of the frame region 2 are 0.06% to 0.08%, which can achieve good supporting effect, as well as uniform and harmonious structure design as demonstrated by test and calculation. For example, when the planar shape of the frame region 2 is a circular ring, the area S of the frame region can be calculated by the formula for calculating the area of circular ring: $S=\pi \times (a2-b2)/4$, where a is the diameter of the circle where the outer ring of the frame region is located, and b is the diameter of the circle where the inner ring of the frame region is located. When the planar shape of the frame region 2 is another shape, it can be calculated in accordance with actual conditions.

For example, the distance between the centers of two adjacent the first support pillars of the plurality of the first support pillars 41 located in the same concentric ring is equal to the length or width of a pixel in the display region 3. It should be noted that the pixel refers to a pixel unit comprising a plurality sub-pixels (e.g., comprising three sub-pixels RGB). When the areas of the frame region 2, as well as the areas of one the first support pillar 41 and one the second support pillar 42 are determined, the numbers of the first support pillars 41 and the second support pillars 42 are determined in accordance with the above described ratio. After calculation, when the distance between the centers of two adjacent the first support pillars of the plurality of the first support pillars 41 located in the same concentric ring is equal to the length or width of a pixel in the display region 3, the first support pillars 41 and the second support pillars 42 have appropriate densities, and are convenient to make, and exhibit good supporting and stabilizing effects. For example, the sum of one second support pillar 42 and the gap between the second support pillars 42 is from 100 μm to 200 μm.

For example, as shown in FIG. 3A, the display panel further comprises a second spacer layer 72. The second spacer layer 72 is located in the third region 23 and between the black matrix 5 and the protection layer 6. The orthographic projections of the plurality of the third support pillars 43 on the first substrate 101 are located within the orthographic projections of the second spacer layer 72 on the first substrate 101. To simplify the manufacture process of the display panel, the second support pillars 42, the third support pillars 43, and the secondary spacers 402 in the display region 3 can be formed by patterning the same film layer with the same mask in one step. Thus, the height of the third support pillars 43 in the direction perpendicular to the first substrate 101, the height of the second support pillars 42 in the direction perpendicular to the first substrate 101, and the height of the secondary spacers 402 are the same. In this case, the height h3 of the third support pillars in the direction perpendicular to the first substrate 101 is limited. The height h3 is superimposed with the thickness of the second spacer layer 72 in the direction perpendicular to the first substrate 101 so that each the third support pillar 43, together with the second spacer layer 72, maintains the distance between the first substrate 101 and the second substrate 102 in the third region 23. When the third support pillars 43 are deformed by a force so as to cause a change of height, the second spacer layer 72 can help to reduce the influence of the change on maintaining the desired distance between the first substrate 101 and the second substrate 102 in the third region 23. Of course, if the simplification of manufacture process is not taken into consideration, the third support pillar 43 can have any height in the direction perpendicular to the first substrate 101 as required.

Figure 3B:
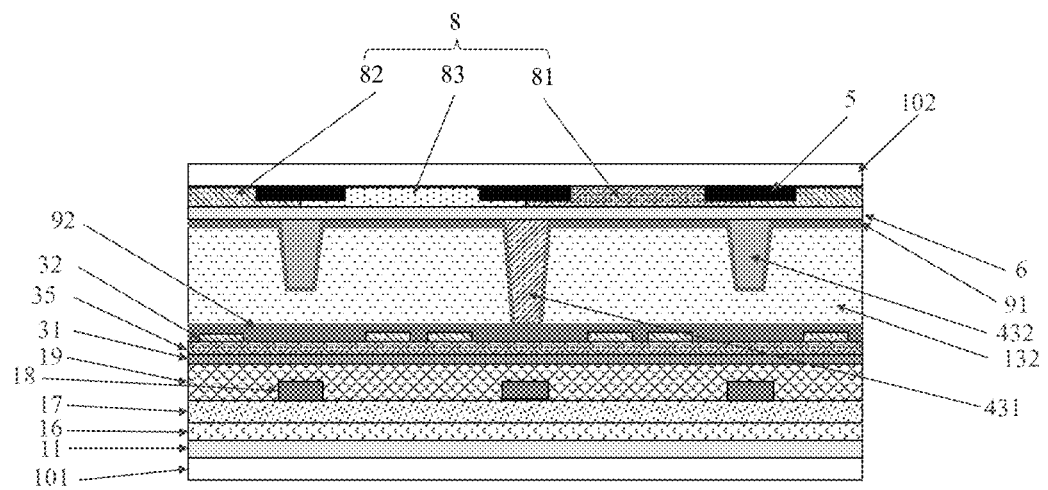
FIG. 3B is a schematic sectional view of the display panel including a part of the driving circuit layer and taken along a first direction provided in an embodiment of the present disclosure.
Figure 3C:
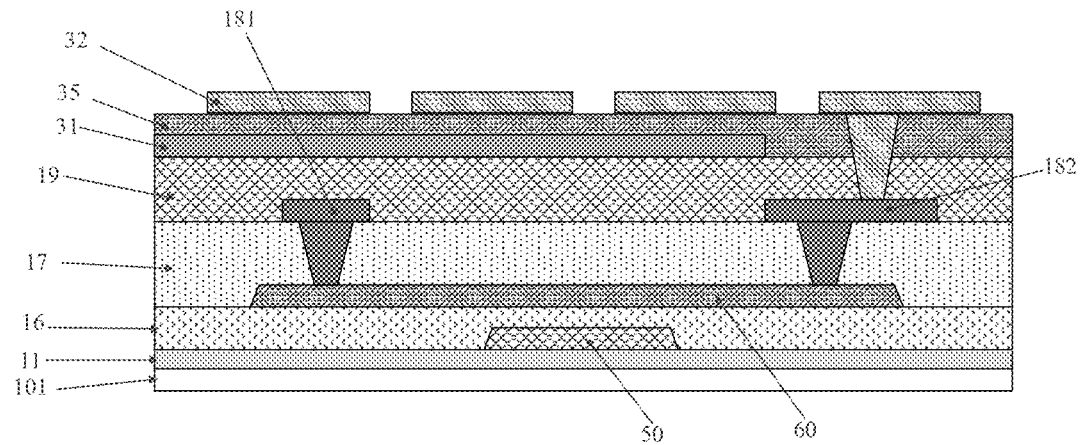
FIG. 3C is a schematic sectional view of a part of the driving circuit layer as shown in FIG. 3B, taken along a second direction.
Figure 3D:
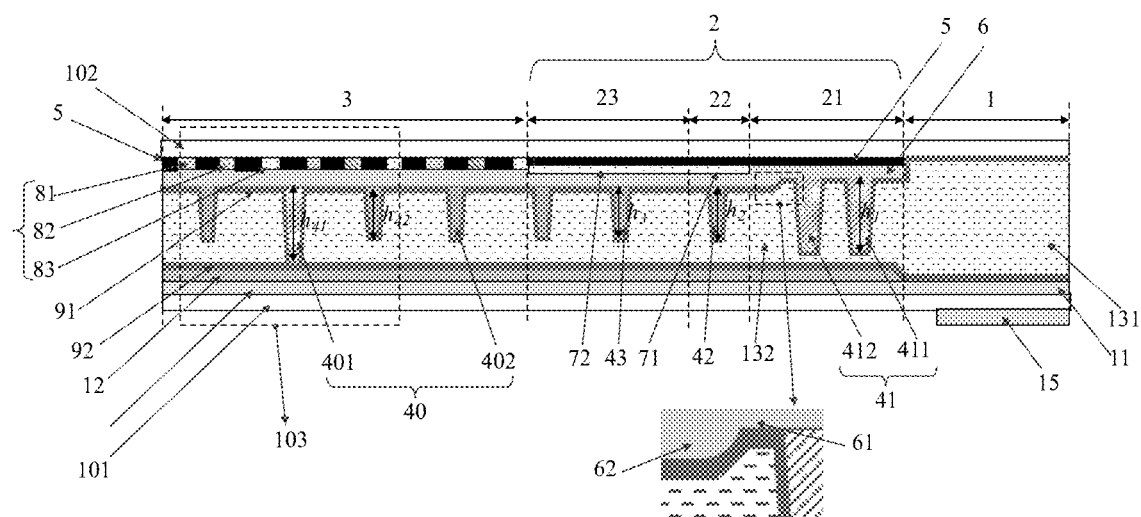
FIG. 3D is another schematic sectional view taken along the line A-A' in FIG. 2A.

For example, in the embodiment as shown in FIG. 3A, the first spacer layer 71 and the second spacer layer 72 are spaced away from each other by the protection layer 6; alternatively, in another embodiment, as shown in FIG. 3D, the first spacer layer 71 is integrated with the second spacer layer 72, to simplify the structure of the display panel. Moreover, in this case, the first spacer layer 71 and the second spacer layer 72 can be formed by performing the same patterning process on the same film layer to simplify the manufacture process.

For example, as shown in FIG. 3A, the display panel comprises a color film layer, which is located on a side of the second substrate 102 adjacent to the first substrate 101, and comprises a first portion, a second portion and a third portion. A portion of the black matrix located in the display region 3 defines a plurality of color sub-pixels 81/82/83. The first portion of the color film layer is located in the plurality of the color sub-pixels 81/82/83 in the display region 3 as the color filter layers for the plurality of color sub-pixels 81/82/83. The second portion of the color film layer is located in the second region 22 and configured to serve as the first spacer layer 71, and the orthographic projection of the second portion of the color film layer on the first substrate 101 overlaps with the orthographic projection of the black matrix 5 on the first substrate 101. The third portion of the color film layer is located in the third region 23 and configured to serve as the second spacer layer 72. As such, it is feasible to simultaneously form the color films in the plurality of the sub-pixels 81/82/83 in the display region 3, the first spacer layer 71 and the second spacer layer 72 by performing a single patterning process on the film layer to form the color film, simplifying the manufacture process and increasing the production efficiency. The first spacer layer 71 and the second spacer layer 72 can be color films of any color, e.g., red, green, blue, white, or the like, and it is not limited in this way in the embodiments of the present disclosure. In the aforesaid embodiments, a portion of the color film layer serves as the first spacer layer 71 and the second spacer layer 72 to simply the manufacture process of the display panel. In this case, e.g., in the embodiment as shown in FIG. 3D, the color film layer in the display region 3 can directly extend to the third region 23 to serve as the second spacer layer 72. Certainly, in other embodiments, the color film layer in the display region 3 can be disconnected to the second spacer layer 72. Other unspecified features of the embodiment as shown in FIG. 3D are the same as those in FIG. 3A, and please refer to the description of the embodiment as shown in FIG. 3A. It should be noted that in other embodiments, the third region 23 can be configured to have no second spacer layer 72. Alternatively, it can be configured to not use a color film layer as the first spacer layer 71 and the second spacer layer 72, but utilize other films to prepare the first spacer layer 71 and the second spacer layer 72. The first spacer layer 71 and the second spacer layer 72 can be an organic film layer or an inorganic film layer. For example, the materials of the organic film layer may be, e.g., a resin; and the materials of the inorganic film layer may be, e.g., silicone oxide, silicon nitride, or silicon dioxide, etc.

For example, the plurality of the spacers 40 located in the display region 3 comprise a plurality of primary spacers 401 and a plurality of secondary spacers 402, the height h41 of the primary spacers 401 in the direction perpendicular to the first substrate 101 is greater than the height h42 of the secondary spacers 402 in the direction perpendicular to the first substrate 101. The shape and size of each of the plurality of the second support pillars 42 and the shape and size of each of the plurality of the third support pillars 43 are the same as a shape and size of each of the plurality of the secondary spacers 402; and the shape and size of the plurality of the first support pillars 41 are the same as the shape and size of the plurality of the primary spacers 401. As such, the height h1 of each of the first support pillars 41 in the direction perpendicular to the first substrate 101 is greater than the height h2 of each the second support pillars 42 in the direction perpendicular to the first substrate 101, and the height h1 of each of the first support pillars 41 in the direction perpendicular to the first substrate 101 is greater than the height h3 of each the third support pillars 43 in the direction perpendicular to the first substrate 101 so as to supplement the step structure between the first region 21 and the second region 22 and the third region 23 caused by absence of a spacer layer. Moreover, it is feasible to form the plurality of the second support pillars 42, the plurality of the third support pillars 43 and the plurality of the secondary spacers 402 by use the same mask in the same patterning process, and form the plurality of the first support pillars 41 and the plurality of the primary spacers 401 by use of the same mask in the same patterning process.

For example, in other embodiments, the plurality of the third support pillars 43 can comprise a plurality of primary support pillars and a plurality of secondary support pillars. The shape and size of each of the plurality of the primary support pillars are the same as the shape and size of each of the plurality of the primary spacers 401, the shape and size of each the plurality of the secondary support pillars are the same as the shape and size of each of the plurality of the secondary spacers 402, so that it is feasible to form the plurality of the second support pillars 42, the plurality of the third support pillars 43 and the plurality of the secondary spacers 402 by use the same mask in the same patterning process, and form the plurality of the first support pillars 41 and the plurality of the primary spacers 401 by use of the same mask in the same patterning process.

For example, as shown in FIG. 3A, the display panel further comprises a buffer layer 11 and a drive circuit layer 12. The buffer layer 11 is located on a side of the first substrate 101 adjacent to the second substrate 102 and in direct contact with the first substrate 101 to prevent the subsequent etching process from damaging the first substrate 101. That is, in the light transmitting region 1, no other layer or structure is present between the buffer layer 11 and the first substrate 101, which is helpful to increase the light transmittance of the light transmitting region 1 to improve the sensing effect of the photoelectric sensing device and achieve a better imaging effect, e.g., better photographing effect, more rapid and accurate fingerprint recognition effect, and the like.

The driving circuit layer 12 is located on a side of the buffer layer 11 away from the first substrate 101 and within the display region 3 and the frame region 2. The plurality of the spacers 40, the plurality of the first support pillars 41, the plurality of the second support pillars 42, the plurality of the third support pillars 43 are all located between the driving circuit layer 12 and protection layer 6, the light transmitting region 1 is not configured to comprise the driving circuit layer 12, the edge of the driving circuit layer 12 adjacent to the light transmitting region 1 is located at the border of the light transmitting region 1 and the first region 21, as shown in FIG. 3A. Because the thickness of the driving circuit layer 12 in the direction perpendicular to the first substrate 101 is greater than the thickness of buffer layer 11 in the direction perpendicular to the first substrate 101, while the light transmitting region 1 is not configured to comprise the driving circuit layer 12, at the edge of the driving circuit layer 12 adjacent to the light transmitting region 1, the driving circuit layer 12 and the buffer layer 11 has a step configuration (or step structure), so that the step configuration (or step structure) at the edge position of the driving circuit layer 12 does not fall within the light transmitting region 1 so as to prevent the step configuration in the light transmitting region 1 from affecting the uniform of the light transmittance and the color uniformity of the transmitted light. Alternatively, in other embodiments, the edge of the driving circuit layer 12 adjacent to the light transmitting region 1 is located in the first region 21.

FIG. 3B is a schematic sectional view of the display panel including a part 103 of the driving circuit layer and taken along a first direction provided in an embodiment of the present disclosure; and FIG. 3C is a schematic sectional view of the display panel including a part 103 of the driving circuit layer as shown in FIG. 3B and taken along a second direction, and the first direction is perpendicular to the second direction. For example, the display panel is a liquid crystal display panel, and a liquid crystal is filled between the first substrate 101 and the second substrate 102. By reference to FIG. 3B and FIG. 3C, the driving circuit layer 12 comprises thin-film transistors. A drive transistor is taken as an example. As shown in FIG. 3B, the thin-film transistor comprises a gate electrode 50, a semiconductor layer 60 and a source and drain electrode layer 18; as shown in FIG. 3C, the source and drain electrode layer 18 comprises a source electrode 181 and a drain electrode 182. The driving circuit layer 12 further comprises a gate insulating layer 16 covering the gate electrode 5, a first insulating layer 17 insulating the semiconductor layer 60 from the source electrode 181 and the drain electrode 182, a common electrode 31, a pixel electrode 32 opposed to the common electrode 31, a second insulating layer 19 insulating the common electrode 31 from the source electrode 181 and the drain electrode 182, and a third insulating layer 35 insulating the common electrode 31 from the pixel electrode 32. The pixel electrode 32 is in electric connection with the drain electrode 182 by a via hole through the second insulating layer 19 and the third insulating layer 35. For example, the common electrode 31 is formed across the surface, but disconnected at a position where the via hole is disposed. By applying a common voltage to the common electrode and a pixel voltage to the pixel electrode, the pixel voltage and the common voltage forms a deflection electric field to deflect the liquid crystal, which are used as an optical switch to achieve a color display in cooperation with the color film layer. For example, the driving circuit layer 12 further comprises various signal lines (not shown), e.g., a power line that supplies a voltage to the common electrode, a gate line that supplies a scan voltage to the gate electrode 50, and a data line that supplies a data voltage to the source electrode 181 and the drain electrode 182, which can be designed with reference to conventional techniques in the art.

For example, as shown in FIG. 3A, in the light transmitting region 1, a first liquid crystal 131 is disposed between the buffer layer 11 and the second substrate 102, and in direct contact with the buffer layer. The first liquid crystal layer 131 comprises a portion on a first orientation layer 91 on the second substrate 102 located in the light transmitting region, a portion on a second orientation layer 92 on the first substrate 101 in the light transmitting region, and a first liquid crystal located between the first orientation layer 91 and the second orientation layer 92. The materials of the first orientation layer 91 and the second orientation layer 92 are, e.g., polyimide (PI). When the first liquid crystal layer is filled between the buffer layer 11 and the second substrate 102, as compared with filling by air, if air is filled, the light will be reflected and refracted on the bottom surface of the second substrate 102 and the top surface of the first substrate 101, thereby reducing the transmittance. The refractive indexes of the first liquid crystal layer and the glass substrate (e.g., the first substrate 101 and the second substrate 102 are both glass substrates) are similar. Therefore, after the first liquid crystal layer 131 is filled, the first substrate 101, the first liquid crystal layer 131 and the second substrate 102 as a whole can be regarded as a medium, so that the number of times of light reflection on the bottom surface of the second substrate 102 and the top surface of the first substrate 101 will be reduced, thereby improving the transmittance. In such embodiment, no protection layer is present between the first substrate 101 and the second substrate 102 in the light transmitting region 1. There are merely the buffer layer 11 and the first liquid crystal layer 131. Neither support pillar nor spacer nor any other structure having a similar height to the first support pillar, the second support pillar, or the spacer is disposed. As compared with this embodiment, if spacers or support pillars or like structures are disposed in the light transmitting region 1, the spacers or support pillars or similar structures will prevent light from passing through the light transmitting region to the photoelectric sensing device so that the region in which the image capturing device is disposed has a relatively low light transmittance, which results in a decreased brightness uniformity and color uniformity of the light passing through the light transmitting region 1 to the photoelectric sensing device 15, and is not beneficial to obtain a better imaging effect.

For example, in the frame region 2 and the display region 3, a second liquid crystal layer 132 is disposed between the protection layer 6 and the driving circuit layer 12. The liquid crystal in the first liquid crystal layer 131 is in communication with the liquid crystal in the second liquid crystal layer 132 via the gaps among the plurality of the first support pillars 41, the gaps among the plurality of the second support pillars 42, and the gaps among the plurality of the third support pillars 43.

Figure 4:
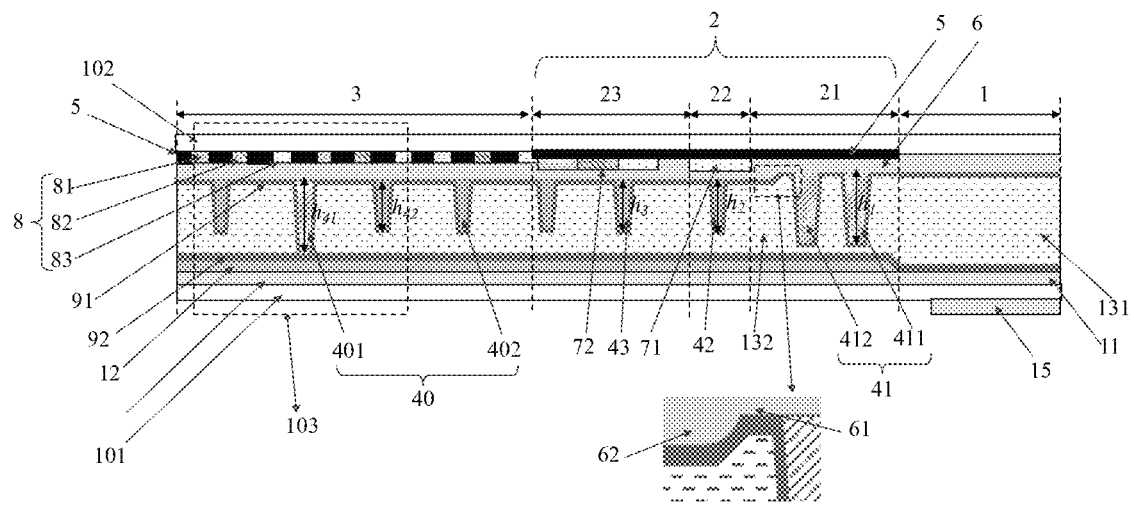
FIG. 4 is still another schematic sectional view taken along the line A-A' in FIG. 2A.

For example, in another embodiment, as shown in FIG. 4, the protection layer 6 further covers the light transmitting region 1. In the light transmitting region 1, the protection layer 6 is in direct contact with the second substrate 102; and the first liquid crystal layer 132 is located between the buffer layer 11 and the protection layer 6, and is in direct contact with the protection layer 6. In this case, in the light transmitting region 1, only the protective 6, the buffer layer 11 and the first liquid crystal layer 132 are disposed between the first substrate 101 and the second substrate 102 to increase the light transmittance of the light transmitting region 1 and improve the brightness uniformity and the color uniformity of the light passing into the photoelectric sensing device 15. At this time, e.g., the protection layer 6 as a whole is formed across the second substrate 102, and does not need a patterning process, and the material of the protection layer 6 is a thermoset material. Other unspecified features of the embodiment as shown in FIG. 4 are the same as those in FIG. 3A, and please refer to the description of the embodiment as shown in FIG. 3A.

Figure 5:
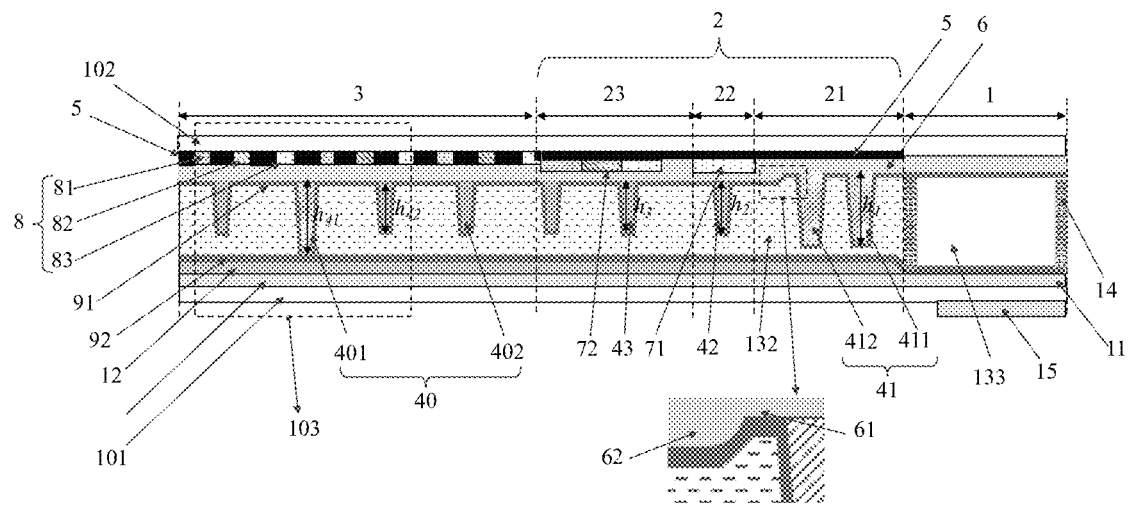
FIG. 5 is yet another schematic sectional view taken along the line A-A' in FIG. 2A.

For example, in another embodiment, as shown in FIG. 5, the light transmitting region 1 is not configured to comprise a liquid crystal layer. In the light transmitting region 1, air is filled between the second substrate 102 and buffer layer 11. The display panel comprises a first sealant 14. The first sealant 14 is located between the second substrate 102 and the buffer layer 11, surrounds the entire light transmitting region 1, and are in direct contact with both the buffer layer 11 and the protection layer 6. In this case, in the light transmitting region 1, only the protective 6, the buffer layer 11 and the air 132 are disposed between the first substrate 101 and the second substrate 102 to increase the light transmittance of the light transmitting region 1 and improve the brightness uniformity and the color uniformity of the light passing into the photoelectric sensing device 15.

Figure 6A:
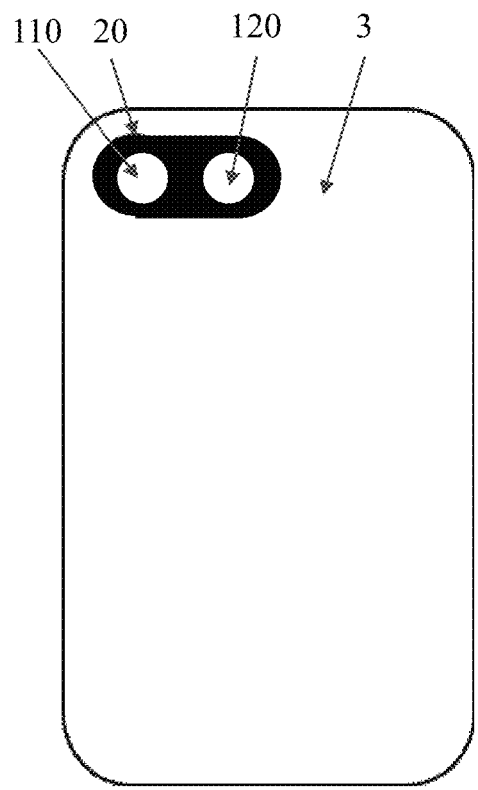
FIG. 6A is an overall schematic planar view of another display panel provided in an embodiment of the present disclosure.
Figure 6B:
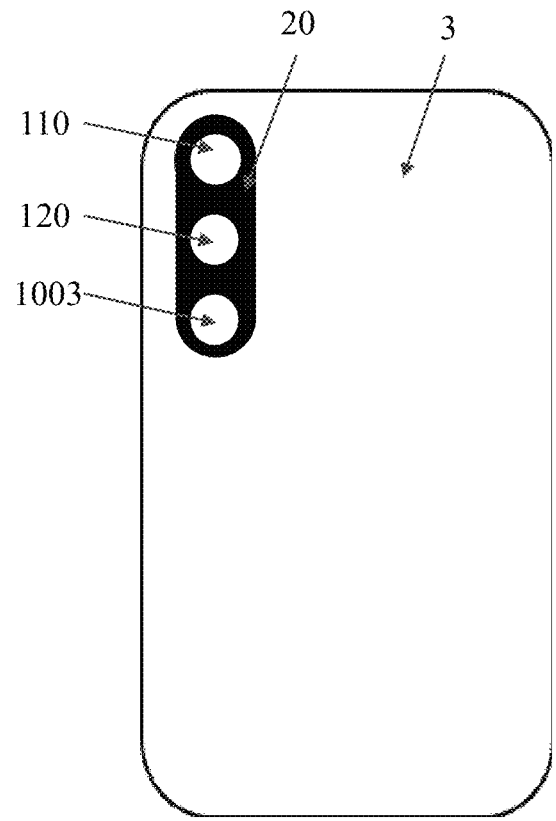
FIG. 6B is an overall schematic planar view of another display panel provided in an embodiment of the present disclosure.
Figure 6C:
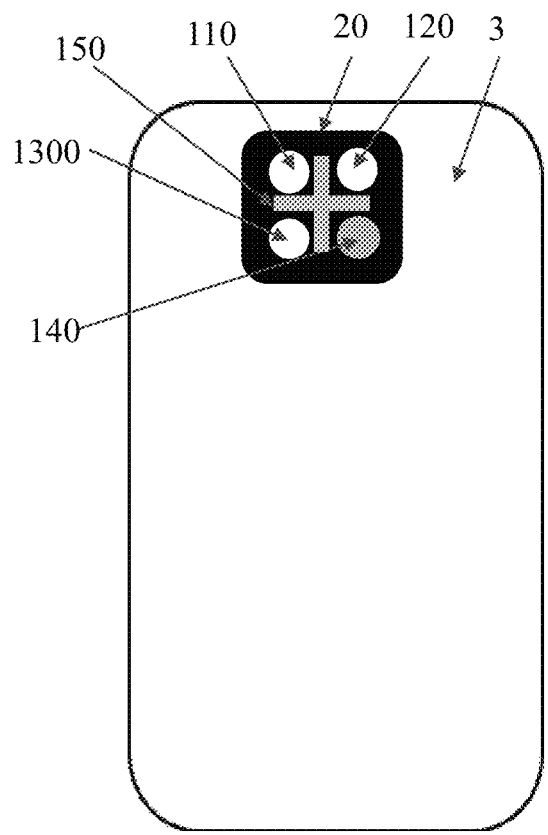
FIG. 6C is an overall schematic planar view of still another display panel provided in an embodiment of the present disclosure.
Figure 7A:
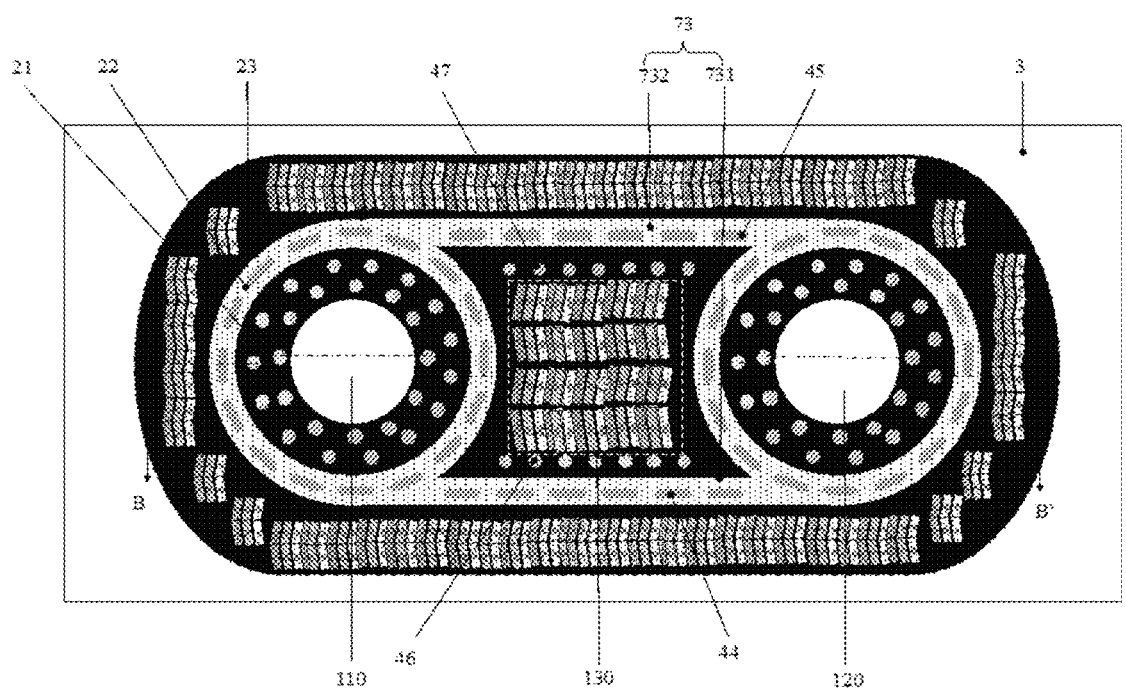
FIG. 7A is an enlarged schematic view of the photoelectric sensing region and its surrounding areas as shown in FIG. 6A.
Figure 7B:
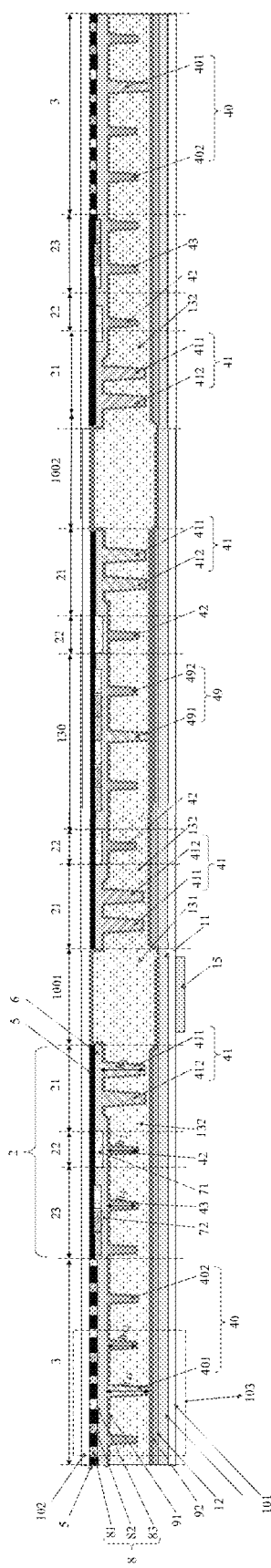
FIG. 7B is a schematic sectional view taken along the B-B' line as shown in FIG. 7.

FIG. 6A is an overall schematic planar view of another display panel provided in an embodiment of the present disclosure; FIG. 6B is an overall schematic planar view of another display panel provided in an embodiment of the present disclosure; FIG. 6C is an overall schematic planar view of yet another display panel provided in an embodiment of the present disclosure; FIG. 7A is an enlarged schematic view of the photoelectric sensing region and its surrounding areas as shown in FIG. 6A; and FIG. 7B is a schematic sectional view taken along the B-B' line as shown in FIG. 7A. For example, in the embodiment as shown in FIG. 6A and FIG. 7A, the display panel comprises a plurality of light transmitting regions. The case in which a display panel comprises two light transmitting regions is taken as an example, and in other embodiments, a display panel can comprise three light transmitting regions (as shown in FIG. 6B), four light transmitting regions (as shown in FIG. 6C), or the like. The number of the light transmittance regions are not limited in the embodiments of the present disclosure. For example, two adjacent light transmitting regions of the plurality of the light transmitting regions are the first light transmitting region 110 and the second light transmitting region 120, respectively. The display panel further comprises: an intermediate region 130, a third spacer layer 73, a plurality of fourth support pillars 44, and a plurality of fifth support pillars 45.

The intermediate region 130 is located between the second region around the first light transmitting region 110 and the second region around the second light transmitting region 120. The third spacer layer 73 is disposed in the same layer as the aforesaid first spacer layer 71 and connected thereto, and comprises a first portion 731 and a second portion 732. The first portion 731 and the second portion 732 are opposed to each other, and the intermediate region 130 is located between the first portion 731 and the second portion 732. The plurality of the fourth support pillars 44 are arranged along the first portion 731 and spaced away from each other. The orthographic projections of the plurality of the fourth support pillars 44 on the first substrate 101 are located in the orthographic projections of the first portion 731 on the first substrate 101. The plurality of the fifth support pillars 45 are arranged along the second portion 732, and spaced away from each other. The orthographic projections of the plurality of the fifth support pillars 45 on the first substrate 101 are located in the orthographic projection of the second portion 732 on the first substrate 101. In the direction perpendicular to the first substrate 101, the plurality of the fourth support pillars 44, the plurality of the fifth support pillars 45 and the plurality of the second support pillars 42 are disposed in the same layer. The shape and size of each of the plurality of the fourth support pillars 44 and the shape and size of each of the plurality of the fifth support pillars 45 are the same as the shape and size of each of the plurality of the second support pillars 42 so as to maintain the same cell thickness of the display panel in respectively regions (a distance between the first substrate 101 and the second substrate 102).

For example, as shown in FIG. 7A, the display panel further comprises: a plurality of sixth support pillars 46 and a plurality of seven support pillars 47. The plurality of the sixth support pillars 46 are located on a side of the first portion 731 adjacent to intermediate region 130, arranged along the first portion 731, and spaced away from each other. The plurality of the seven support pillars 47 are located on a side of the second portion 732 adjacent to intermediate region 130, arranged along the second portion 732, and spaced away from each other. In the direction perpendicular to the first substrate 101, the plurality of the sixth support pillars 46, the plurality of the seven support pillars 47 and the plurality of the first support pillars 41 are disposed in the same layer. The shape and size of each of the plurality of the sixth support pillars 46 and the shape and size of each of the plurality of the seven support pillars 47 are the same as the shape and size of each of the plurality of the first support pillars 41. Moreover, no spacers are disposed at the positions where the plurality of the sixth support pillars 46 and the plurality of the seven support pillars 47 are located so as to maintain the same cell thickness at these positions and in the first region 21. This embodiment can provide support in the frame region between two adjacent light transmitting regions, maintaining the same cell thickness, and further improve the stability of the frame region between two adjacent light transmitting regions to maintain the uniformity of the two light transmitting regions.

For example, the planar shapes of the first portion 731 and the second portion 732 are both linear sections which are parallel to each other so that the structure is flat, simple, and easy to manufacture. Of course, in other embodiments, the planar shapes of the first portion 731 and the second portion 732 can also comprise broken lines, smooth curves, etc., and can be designed in accordance with actual requirements of the frame regions, as long as the region between the two adjacent light transmitting regions can provide support effect as desired by the aforesaid embodiments.

For example, in the embodiment as shown in FIG. 7, the third region surrounding the first light transmitting region 110 and the third region surrounding the second light transmitting region 120 are connected to each other to form an integrated region, which surrounds the entire frame region to separate the display region 3 from the frame region so that a transition is formed between the frame region and the display region 3 to maintain the stability of the edge of the display region 3 adjacent to the frame region.

In the embodiments as shown in FIGS. 7A-7B, the black matrix 5 covers the intermediate region 130 so that the intermediate region 130 is not light transmissive. The structure of the intermediate region 130 is the same as the structure of the aforesaid third region 23. For example, when the third support pillars 43 in the third region 23 comprises a plurality of primary support pillars and a plurality of secondary support pillars, as shown in FIG. 7B, a plurality of intermediate spacers 49 are disposed in the intermediate region 130, and comprise a plurality of intermediate primary spacers 491 and a plurality of intermediate secondary spacers 492. The shape and size of each of the plurality of the intermediate primary spacers 491 are the same as the shape and size of each of the plurality of the primary support pillars in the third region 23 and the shape and size of each of the plurality of the primary spacers 401 in the display region 3; and the shape and size of each of the plurality of the intermediate secondary spacers 492 are the same as the shape and size of each of the plurality of the secondary support pillars in the third region 23 and the shape and size of each of the plurality of the secondary spacers 402 in the display region 3 so as to maintain the same cell thickness in the intermediate region and the first region 21. Moreover, the plurality of the intermediate secondary spacers 492, the plurality of the second support pillars 42, the plurality of the secondary support pillars and the plurality of the secondary spacers 402 can be made with the same mask in the same, while the plurality of the intermediate primary spacers 491, the plurality of the first support pillars 41, the plurality of the primary support pillars and the plurality of the primary spacers 401 can be made with the mask in the same process. Other unspecified features of the embodiment as shown in FIG. 7A are the same as those in FIG. 3A, and please refer to the description of the embodiment as shown in FIG. 3A.

In other embodiments, the plurality of the third support pillars 43 in the third region 23 do not comprise any primary support pillar, and the intermediate region 130 do not comprise any intermediate primary spacer. Rather, the shape and size of each of the plurality of the intermediate spacers 49 in the intermediate region 130 and the shape and size of each of the plurality of the third support pillars 43 in the third region 23 are all the same as the shape and size of each of the plurality of the secondary spacers 402 in the display region 3. For example, the plurality of the third support pillars 43 in the third region 23 comprise the primary support pillar, the plurality of the intermediate spacers 49 in the intermediate region 130 do not comprise the intermediate primary spacers 491. Alternatively, the plurality of the third support pillars 43 in the third region 23 do not comprise the primary support pillars, and the plurality of the intermediate spacers 49 in the intermediate region 130 comprise the intermediate primary spacers 491. Namely, the aforesaid features can be combined with each other.

Figure 8A:
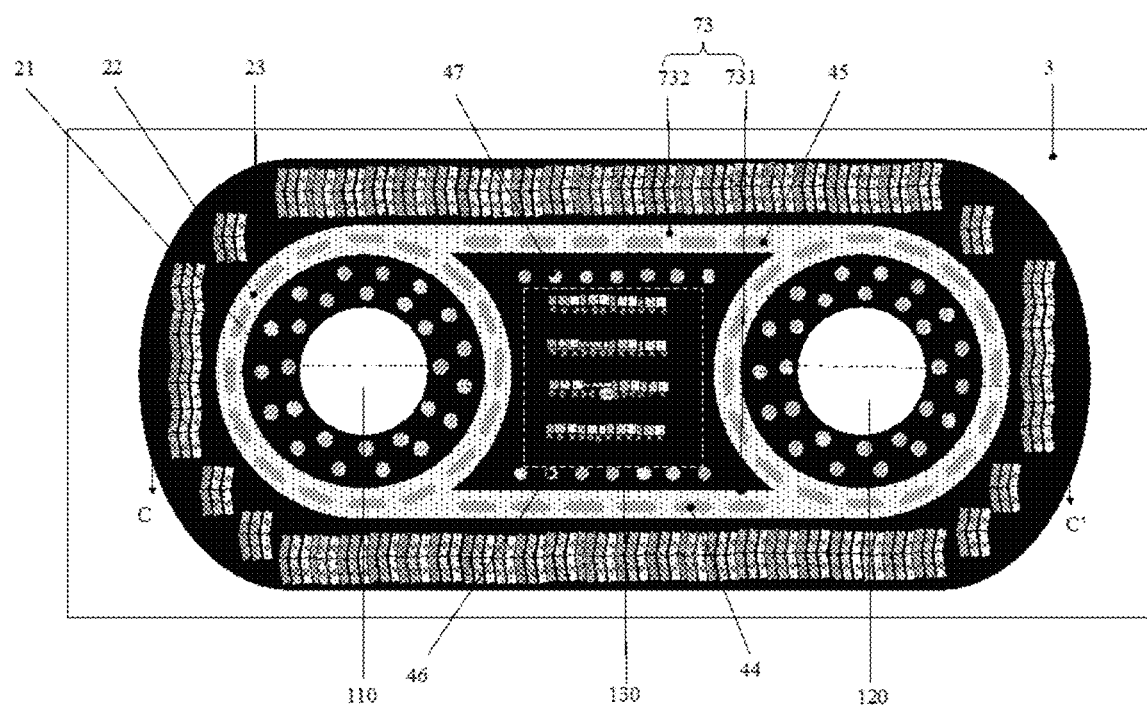
FIG. 8A is another enlarged schematic view of the photoelectric sensing region and its surrounding area as shown in FIG. 6A.
Figure 8B:
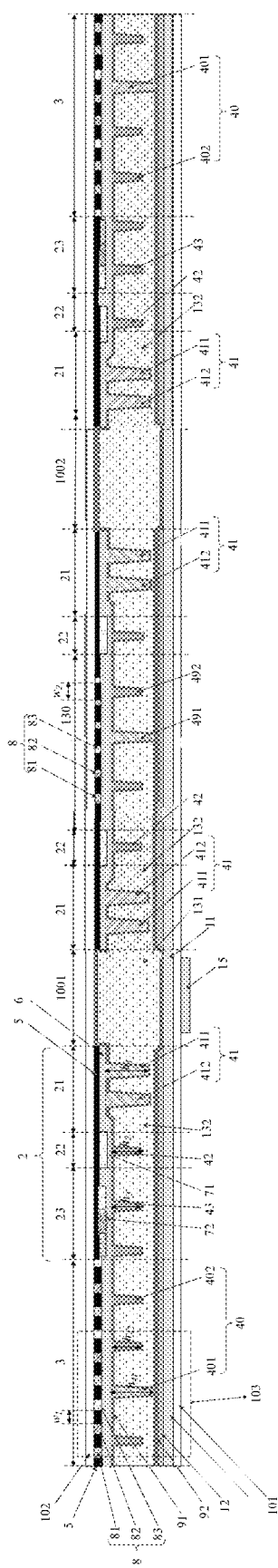
FIG. 8B is a schematic sectional view taken along the C-C' line in FIG. 8A.

FIG. 8A is another enlarged schematic view of the photoelectric sensing region and its surrounding areas as shown in FIG. 6A, and FIG. 8B is a schematic sectional view taken along the line C-C' in FIG. 8A. For example, the embodiment as shown in FIGS. 8A-8B differs from that shown in FIG. 7A in that the intermediate region 130 is an intermediate display region comprising a plurality of the intermediate pixels arranged in an array; each of the plurality of the intermediate pixels comprises a plurality of the intermediate color sub-pixels; the black matrix 5 defines the plurality of the intermediate color sub-pixels in the intermediate display region 130; the light transmittance of the intermediate display region 130 is less than the light transmittance of the display region 3. That is, the intermediate display region 130 is a gray display region. The brightness of the intermediate display region 130 is relatively low, and not 30% greater than the brightness of the display region 3. For example, by allowing the portion of the black matrix 5 located in intermediate display region 130 and the portion of the black matrix 5 located in the display region 3 to have different areas, the aperture ratio of the intermediate display region 130 is less than the aperture ratio of the display region 3. For example, in the embodiments as shown in FIG. 8A and FIG. 8B, the line width w2 of the black matrix 5 located in intermediate display region 130 is greater than the line width w1 of the portion of the black matrix 5 located in the display region 3 so as to achieve that the brightness of the intermediate display region 130 is not 30% greater than the brightness of the display region 3. Of course, in other embodiments, it is also feasible to provide an additional light transmittance adjustment film, such as, a light filter layer (other than the above-described color film layer) to decrease the light transmittance of the intermediate display region 130 so as to achieve that the brightness of the intermediate display region 130 is not 30% greater than the brightness of the display region 3. In this embodiment, the brightness of the intermediate display region 130 is decreased to achieve a dark display. For example, the intermediate display region 130 always displays a black image by a display drive circuit. It can simplify the structure of the intermediate display region 130, simplify the design of the display drive circuit, decrease the process difficulty, and does not substantially affect the display effect near the intermediate display region 130 due to the small area of the intermediate display region 130.

Alternatively, in other embodiments, the intermediate display region 130 is a normal display region, and the light transmittance of the intermediate display region 130 is equal to the light transmittance of the display region 3, that is, a normal display, so as to improve the display quality near the intermediate display region 130 and improve the user's experience.

For example, in the embodiment as shown in FIG. 8A, the display panel further comprises a plurality of the intermediate spacers, and the plurality of the intermediate spacers are located in the intermediate display region 130 arranged in an array. For example, the structure of the plurality of the intermediate spacers are the same as the structure of the plurality of the spacers 40 in the display region 3.

For example, in at least one embodiment, the arrangement density of the plurality of intermediate secondary spacers 492 in the intermediate display region 130 is less than the arrangement density of the plurality of spacers 402 in the display region 3. For example, in the intermediate display region, the arrangement density of the intermediate primary spacers 491 is less than the plurality of the primary spacers 401 in the display region 3, and the arrangement density of the intermediate secondary spacers 492 is less than the arrangement density of the plurality of the secondary spacers 402 in the display region 3. For example, the arrangement density of the secondary spacers 402 in the display region 3 is 287/288, that is, the display region 3 is configured to contain 287 the secondary spacers 402 per 288 sub-pixels; and the arrangement density of the primary spacers 401 is 1/288, that is, the display region 3 is configured to contain 1 primary spacer per 288 sub-pixels. However, in the intermediate display region, the arrangement density of the intermediate secondary spacers 492 is 70/72, that is, 70 intermediate secondary spacers are disposed in the intermediate display region per 72 sub-pixels; for example, the arrangement density of the intermediate primary spacers is 1/72, that is, 1 intermediate primary spacer 491 is disposed in the intermediate display region per 72 sub-pixels. As set forth above, as compared with the display region 3, the black matrix 5 in the intermediate display region has a relatively large area. During the manufacture of the display panel, after formation of the black matrix 5, the black matrix 5 defines a plurality of the sub-pixel openings in the display region 3 and defines a plurality of the intermediate sub-pixel openings in the intermediate display region; the opening size of each of intermediate sub-pixels is less than the opening size of each of sub-pixels. During subsequent process of forming, e.g., the protection layer 6, as compared with the intermediate sub-pixel opening, the film layer for forming the protection layer 6 is easier to enter the sub-pixel openings. Thus, the portion of the finally solidified protection layer 6 located in the intermediate display region has a greater thickness in the direction perpendicular to the first substrate 101 than the thickness in the direction perpendicular to the first substrate 101 of the portion of the protection layer 6 located in the display region 3. That is, the protection layer further covers the intermediate display region; the portion of the protection layer covering the intermediate display region has s greater thickness in the direction perpendicular to the first substrate than the thickness in the direction perpendicular to the first substrate of the portion of the protection layer covering the intermediate display region. As a result, the spacers with the same size in the display region 3 are easier to deform than those with the same size in the intermediate display region under external force, that is, the intermediate primary spacers 491 and the intermediate secondary spacers 492 in the intermediate display regions are less prone to deform. Because the number and the arrangement density of the intermediate secondary spacers 492 are far greater than the number and the arrangement density of the intermediate primary spacers, the number and the arrangement density of the secondary spacers 492 have a greater influence on the cell thickness stability of the intermediate display region 130. Therefore, the arrangement density of the intermediate secondary spacer 492 in the intermediate display region 130 is less than that of the secondary spacer 402 in the display region 3, so as to increase the possibility amount of deformation of the intermediate secondary spacer 492 in the intermediate display region 130 so that it can play a sufficient buffer role in the intermediate display region, maintain a stable cell thickness, and maintain the same cell thickness as the display region 3 as much as possible.

In FIG. 6A-6B, the plurality of the light transmitting regions are arranged along a line, that is, the planar arrangement pattern of the plurality of the light transmitting regions is a linear section. In other embodiments, the plurality of light transmitting regions may not be arranged along a straight line. For example, the planar arrangement pattern of the plurality of the light transmitting regions is a triangle, a rectangle or other polygons, or a circle, which is not limited in the embodiment of the present disclosure. As for the cases that the display panel comprises three, fourth or more light transmitting regions, the structure of the intermediate region between any two adjacent light transmitting regions are the same as that of the intermediate region in FIGS. 7A-7B, or the same as that of the intermediate display region in FIGS. 8A-8B, and the aforesaid third regions 23 are present between the frame region 2 and the display region 3, which is not reiterated here.

As an example, in the embodiment as shown in FIG. 6C, the photoelectric sensing region 20 comprises at least three light transmitting region, e.g., comprising a first light transmitting region 110, a second light transmitting region 120, a third light transmitting region 1300, and an auxiliary functional region 140. For example, the auxiliary functional region 140 is a supplementary light region for providing supplementary light configured to emit supplementary light when the first light transmitting region 110, the second light transmitting region 120 and the third light transmitting region 1300 operates. The supplementary light can be reflected by any object to be imaged, such as a finger (when the photoelectric sensing device is a fingerprint recognition device) or a face (when the photoelectric sensing device is a face recognition device or a camera), and then incident into the first light transmitting region 110, the second light transmitting region 120 and the third light transmitting region 1300 to be absorbed by the photoelectric sensing device disposed in the first light transmitting region 110, the second light transmitting region 120 and the third light transmitting region 1300 so as to improve the imaging quality of the photoelectric sensing device when the external light is insufficient. For example, in other embodiments, the auxiliary functional region 140 is also replaced with the fourth light transmitting region, that is, the photoelectric sensing region 20 comprises fourth light transmitting regions, and each of the four light transmitting regions is used to provide the aforesaid photoelectric sensing device. At this time, the first light transmitting region 110, the second light transmitting region 120, the third light transmitting region 1300 and the fourth light transmitting region 140 are arranged in a 2×2 matrix, and the planar arrangement pattern thereof is a rectangle.

For example, as shown in FIG. 6C, the first light transmitting region 110, the second light transmitting region 120 and 1300 and auxiliary functional region are arranged in a 2×2 matrix, an interval between the first row and the second row of the 2×2 matrix and an interval between the first column and the second column of the 2×2 matrix form a cross region 150, and the structure of the cross region 150 is the same as the structure of the intermediate region. Other structures between the adjacent two, e.g., the fourth support pillars, the fifth support pillars, the sixth support pillars, the seven support pillars, etc. are all the same as those for the previous embodiments, which are not reiterated here.

Figure 6D:
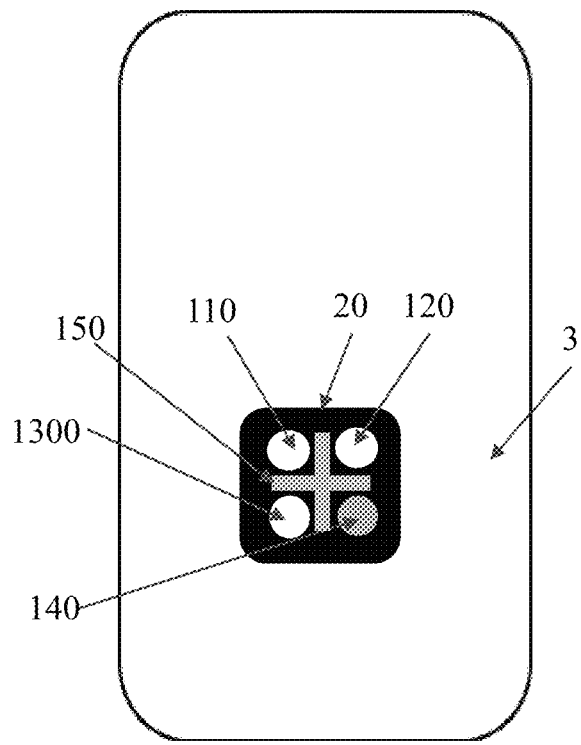
FIG. 6D is an overall schematic planar view of another display panel provided in an embodiment of the present disclosure.

In the above embodiments, the position of the photoelectric sensing region 20 is near the edge of the display panel, that is, near the non-display region, to facilitate to connect the signal lines located in the non-display region and for controlling the operation of the photoelectric sensing device in the photoelectric sensing region 20 to the photoelectric sensing region 20, e.g., these signal lines can be directly connected to the photoelectric sensing region 20 from the non-display region without passing through the display region. However, in other embodiments, the photoelectric sensing region 20 can also be located at another position. For example, FIG. 6D is an overall schematic planar view of yet another display panel provided in an embodiment of the present disclosure. As shown in FIG. 6D, the photoelectric sensing region 20 is located in the intermediate regions of the display panel. At this time, at least a portion of the aforesaid signal lines, such as, a power line (a VDD line, etc.) needs to pass through the display region 3, and the orthographic projection of the signal line is located in the black matrix. If necessary, an insulating layer can be provided between this signal line and the signal line(s) in the black matrix to prevent a signal crosstalk.

For example, in the above embodiments, the display panel is a liquid crystal display panel, the first substrate 101 is an array substrate, and the second substrate 102 is a color film substrate. Alternatively, in other embodiments, the display panel is an organic light-emitting diode (OLED) display panel, the first substrate 101 is an array substrate, the second substrate 102 is a package cover plate, and other respective structures can be designed in accordance with the configuration of the OLED display panel. Of course, in the OLED display panel, it is also feasible to use a film for package, instead of a packing cover panel.

In the embodiments of the present disclosure, e.g., the first substrate 101 and the second substrate 102 are both substrate substrates, such as, glass substrates, quartz substrates, polyimide substrates, or the like. The particular materials of the first substrate 101 and the second substrate 102 are not limited in the embodiments of the present disclosure.

Figure 9:
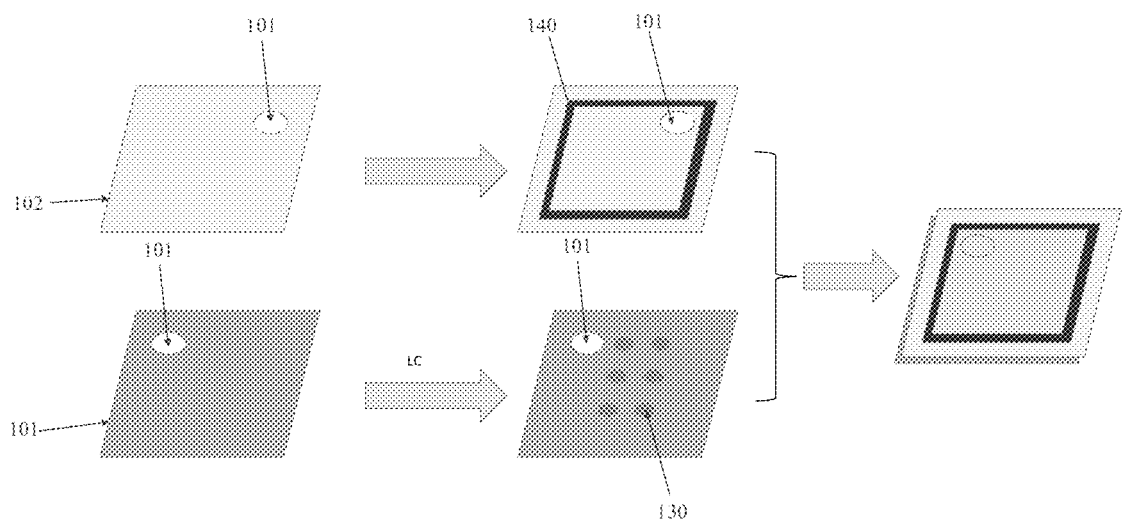
FIG. 9 is a schematic diagram of a method of preparing a display panel provided in an embodiment of the present disclosure.

FIG. 9 is a schematic diagram of a method of preparing a display panel provided in an embodiment of the present disclosure. As shown in FIG. 9, a buffer layer 11, a driving circuit layer 12, a second orientation layer 92, as well as first support pillars, second support pillars, third support pillars and spacers are sequentially formed on the first substrate 101, and a black matrix 5, a plurality of pixels, a first spacer layer, a second spacer layer and a protection layer and other desired film layers are sequentially formed on the second substrate 102. For example, a second sealant 140 is applied around the display region onto the second substrate 140; and a liquid crystal is dropped onto the first substrate 101. Since the area of the light transmitting region 1 is very small as compared with the droplets of the liquid crystal, it is difficult to precisely drop the liquid crystal into the light transmitting region 1. Thus, the liquid crystal can be dropped into the display region 3 or other regions with a relatively large area. Then, the second substrate 102 and the first substrate 101 are assembled, and the second substrate 102 and the first substrate 101 are bonded together via the second sealant 140. The liquid crystal flows into the light transmitting region 1 sequentially through the second region 22 and the first region 21, as well as the gaps between the plurality of the first support pillars 41 and the gaps between the plurality of the second support pillars 42, so that the liquid crystal is filled into the light transmitting region 1.

In the method of preparing the display panel, the first spacer layer 71 and the second spacer layer 72 can be formed by performing the same patterning process on the same film layer. By performing the same patterning process on the film layer for forming the color film to simultaneously forming the color films in the plurality of the sub-pixels 81/82/83, the first spacer layer 71, and the second spacer layer 72, forming the plurality of the second support pillars 42, the plurality of the third support pillars 43, the plurality of the secondary spacers 402 and the plurality of the fourth support pillars 44 and the plurality of the fifth support pillars 45 with the same mask in the same patterning process, and forming the plurality of the first support pillars 41, the plurality of the primary spacers 401 and the plurality of the sixth support pillars 46 and the plurality of the seven support pillars 47 with the same mask in the same patterning process, the manufacture process is simplified. In addition, the structure of the plurality of the intermediate spacers and the plurality of the spacers 40 in the display region 3 are formed with the same mask in the same patterning process.

For example, during the formation of the display panel as shown in FIG. 3A, after forming the protective material layer covering the entire second substrate 102, the protective material layer is patterned with a mask to remove a portion of the protective material layer located in the light transmitting region 1 to form the protection layer 6 as shown in FIG. 3A. Here, e.g., the material of the protection layer 6 may be a photosensitive material, e.g., a photosensitive resin.

For example, during the formation of the display panel as shown in FIG. 5, after forming the first sealant 14 around the entire light transmitting region 1 on the first substrate 11, e.g., by precise application, a liquid crystal is dropped onto the display region 3 on the first substrate 11, and then the substrates are assembled.

Figure 10:
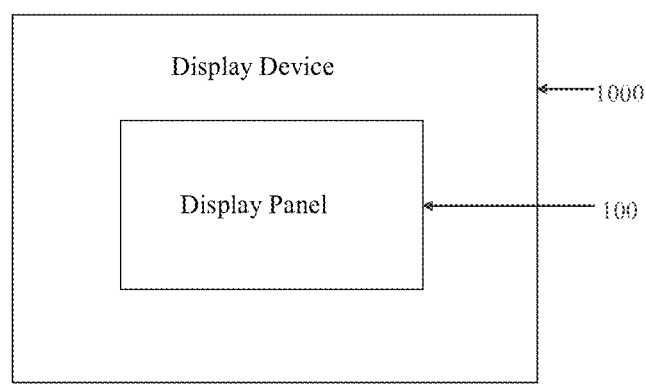
FIG. 10 is a schematic view of a display device provided in an embodiment of the present disclosure.

FIG. 10 is a schematic view of a display device provided in an embodiment of the present disclosure. As shown in FIG. 10, the display device 1000 comprises any one of display panels 100 as provided in the embodiments of the present disclosure. For example, the display device 1000 may be a liquid crystal display device or an OLED display device. For example, the display device can be realized as the following products: mobile phones, tablet computers, displays, notebook computers, ATMs, or any other product or component having a display function. The display device 1000 have all the technical effects of the display panel 100, which are not reiterated here.

For example, the side of the second substrate 102 away from the first substrate 101 is a display side. The display device further comprises the photoelectric sensing device 15, as shown in FIG. 3A. For example, the photoelectric sensing device 15 is located on a side of the first substrate 101 away from the second substrate 102, and configured to receive a light from the display side, that is, light from the display side passes through the light transmitting region into the photoelectric sensing device 15. The light received by the photoelectric sensing device 15 in the display device provided in the embodiments of the present disclosure is in a relatively large amount, has relatively high uniformity of brightness and color.

For example, other structures of the display device 1000, e.g., a backlight source as required in the liquid crystal display device, etc., can be designed by referenced to conventional technology in the art, which are not limited in the embodiments of the present disclosure.

For example, the display device may be a display module. For example, it comprises the aforesaid display panel and the photoelectric sensing device 15, or comprises the aforesaid display panel and a backlight source. Alternatively, it can be a display apparatus which further comprises other structures, such as, mobile phones, tablet computers, displays, notebook computers, ATMs, or other products as set forth above.

What are described above is related to the illustrative embodiments of the disclosure only and not limitative to the scope of the disclosure; the scopes of the disclosure are defined by the accompanying claims.

What is claimed is:

1. A display panel comprising:
a display region and a photoelectric sensing region, wherein the display region is located outside the photoelectric sensing region, the display region comprises a plurality of pixels arranged in an array, each pixel of the plurality of the pixels comprises a plurality of color sub-pixels; and the photoelectric sensing region comprises a light transmitting region and a frame area that surrounds the light transmitting region, wherein the frame region comprises:
a first region surrounding the light transmitting region;
a second region located on a side of the first region away from the light transmitting region and surrounding the first region; and
a third region located on a side of a second region away from the light transmitting region and located between the second region and the display region to separate the second region from the display region;
a plurality of spacers arranged in an array, wherein the plurality of the spacers is located inside the display region while outside of the light transmitting region;
a plurality of first support pillars located inside the first region, arranged around the light transmitting region, and spaced away from each other;
a plurality of second support pillars located inside the second region, arranged around the second region, and spaced away from each other; and
a plurality of third support pillars located in the third region and arranged in an array,
wherein the third region is a non-display region, and an arrangement density and an arrangement form of the plurality of third support pillars arranged in the array in the third region are same as the arrangement density and the arrangement form of the plurality of spacers arranged in the array inside the display region.

2. The display panel according to claim 1, wherein a planar arrangement pattern of the plurality of the first support pillars comprises at least a ring, or
the planar arrangement pattern of the plurality of the first support pillars comprises a plurality of concentric rings;
along radial directions of the concentric rings, the first support pillars in the plurality of the concentric rings are aligned with each other, or the first support pillars in adjacent concentric rings of the plurality of the concentric rings are staggered to each other.

3. The display panel according to claim 2, wherein a ratio of a total area of the orthographic projections of the plurality of the first support pillars on the first substrate to a total area of the orthographic projections of the plurality of the second support pillars on the first substrate is from 5 to 10.

4. A display panel comprising:
a display region and a photoelectric sensing region, wherein the display region is located outside the photoelectric sensing region, the display region comprises a plurality of pixels arranged in an array, each pixel of the plurality of the pixels comprises a plurality of color sub-pixels; and the photoelectric sensing region comprises a light transmitting region and a frame area that surrounds the light transmitting region, wherein the frame region comprises:
a first region surrounding the light transmitting region;
a second region located on a side of the first region away from the light transmitting region and surrounding the first region; and
a third region located on a side of a second region away from the light transmitting region and located between the second region and the display region to separate the second region from the display region;
a plurality of spacers arranged in an array, wherein the plurality of the spacers is located inside the display region while outside of the light transmitting region;
a plurality of first support pillars located inside the first region, arranged around the light transmitting region, and spaced away from each other;
a plurality of second support pillars located inside the second region, arranged around the second region, and spaced away from each other; and
a plurality of third support pillars located in the third region and arranged in an array,
wherein the display panel further comprises:
a first substrate;
a second substrate opposite to the first substrate;
a black matrix located on a side of the second substrate adjacent to the first substrate, covering the frame area, and defining the plurality of the color sub-pixels in the display region, wherein orthographic projections of the plurality of the spacers, orthographic projections of the plurality of the first support pillars, orthographic projections of the plurality of the second support pillars, and orthographic projections of the plurality of the third support pillars on the first substrate are located within an orthographic projection of the black matrix on the first substrate; and
a protection layer located in the second substrate adjacent to and located on a side of the black matrix adjacent to the first substrate, covering the frame region and the display region, wherein the plurality of the spacers, the plurality of the first support pillars, the plurality of the second support pillars, and the plurality of the third support pillars are located between the first substrate and the protection layer to maintain a distance between the first substrate and the second substrate.

5. The display panel according to claim 4, further comprising:
a first spacer layer located in the second region and located between the black matrix and the protection layer, and the orthographic projections of the plurality of the second support pillars are located within an orthographic project of the first spacer layer on the first substrate.

6. The display panel according to claim 4, further comprising:
a buffer layer located on a side of the first substrate adjacent to the second substrate and directly contacted with the first substrate; and
a driving circuit layer located on a side of the buffer layer away from the first substrate and between the display region and the frame area, wherein the plurality of the spacers, the plurality of the first support pillars, the plurality of the second support pillars, and the plurality of the third support pillars are all located between the driving circuit layer and the protection layer, the driving circuit layer is not disposed in the light transmitting region, and an edge of the driving circuit layer adjacent to the light transmitting region is in the first region or on a border between the light transmitting region and the first region.

7. The display panel according to claim 6, wherein in the light transmitting region, a first liquid crystal layer is disposed between the buffer layer and the second substrate, and the first liquid crystal layer in in direct contact with the buffer layer;
in the frame region and the display region, a second liquid crystal layer is disposed between the protection layer and the driving circuit layer, a liquid crystal in the first liquid crystal layer is in communication with a liquid crystal in the second liquid crystal layer through gaps among the plurality of the first support pillars, gaps among the plurality of the second support pillar, and gaps among the plurality of the third support pillars.

8. The display panel according to claim 6, wherein
no liquid crystal is disposed in the light transmitting region;
in the light transmitting region, a gap between the second substrate and the buffer layer is filled with air;
the display panel comprises a first sealant, and the first sealant is located between the second substrate and the buffer layer, surrounds the light transmitting region, and is in direct contact with the buffer layer and the protection layer.

9. A display device comprising the display panel according to claim 4.

10. The display device according to claim 9, wherein a side of the second substrate away from the first substrate is a display side;
the display device further comprises:
a photoelectric sensing device located in the light transmitting region and on a side of the first substrate away from the second substrate, and configured to receive light from the display side.

11. A display panel comprising:
a display region and a photoelectric sensing region, wherein the display region is located outside the photoelectric sensing region, the display region comprises a plurality of pixels arranged in an array, each pixel of the plurality of the pixels comprises a plurality of color sub-pixels; and the photoelectric sensing region comprises a light transmitting region and a frame area that surrounds the light transmitting region, wherein the frame region comprises:
a first region surrounding the light transmitting region;
a second region located on a side of the first region away from the light transmitting region and surrounding the first region; and
a third region located on a side of a second region away from the light transmitting region and located between the second region and the display region to separate the second region from the display region;

a plurality of spacers arranged in an array, wherein the plurality of the spacers is located inside the display region while outside of the light transmitting region;

a plurality of first support pillars located inside the first region, arranged around the light transmitting region, and spaced away from each other;

a plurality of second support pillars located inside the second region, arranged around the second region, and spaced away from each other; and a plurality of third support pillars located in the third region and arranged in an array, wherein the display panel further comprises:

a first substrate;

a second substrate opposite to the first substrate;

a black matrix located on a side of the second substrate adjacent to the first substrate, covering the frame area, and defining the plurality of the color sub-pixels in the display region, wherein orthographic projections of the plurality of the spacers, orthographic projections of the plurality of the first support pillars, orthographic projections of the plurality of the second support pillars, and orthographic projections of the plurality of the third support pillars on the first substrate are located within an orthographic projection of the black matrix on the first substrate; and a protection layer located in the second substrate adjacent to and located on a side of the black matrix adjacent to the first substrate, covering the frame region and the display region, wherein the plurality of the spacers, the plurality of the first support pillars, the plurality of the second support pillars, and the plurality of the third support pillars are located between the first substrate and the protection layer to maintain a distance between the first substrate and the second substrate;

in the first region, the protection layer is directly contacted with the black matrix;

the protection layer has a step configuration in the first region, the step configuration comprises a first portion away from the second region and a second portion adjacent to the second region; and in a direction vertical to the first substrate, a height of the first portion is less than a height of the second portion, and a height of the first support pillars is greater than a height of the second support pillars.

12. The display panel according to claim 11, further comprising:

a second spacer layer located in the third region and located between the black matrix and the protection layer, and the orthographic projections of the plurality of the third support pillars are located within an orthographic project of the second spacer layer on the first substrate.

13. The display panel according to claim 12, further comprising:

a color film layer located on a side of the second substrate adjacent to the first substrate and comprises a first portion, a second portion and a third portion, wherein the first portion of the color film layer is located in the plurality of the color sub-pixels in the display region, and an orthographic projection of the first portion of the color film layer on the first substrate does not overlap with the orthographic projection of the black matrix on the first substrate;

the second portion of the color film layer is located in the second region and configured as the first spacer layer, and an orthographic projection of the second portion of the color film layer in the first substrate overlaps with the orthographic projection of the black matrix in the first substrate; and the third portion of the color film layer is located inside the third region and configured as the second spacer layer.

14. The display panel according to claim 13, wherein the plurality of the spacers located in the display region comprise a plurality of primary spacers and a plurality of secondary spacers, a height of the primary spacers in the direction vertical to the first substrate is greater than a height of the secondary spacers in the direction vertical to the first substrate;

a shape and size of each of the plurality of the second support pillars and a shape and size of each of the plurality of the third support pillars are identical with a shape and size of each of the plurality of the secondary spacers; and a shape and size of each of the plurality of the first support pillars are identical with a shape and size of each of the plurality of the primary spacers.

15. The display panel according to claim 13, further comprising a plurality of light transmitting regions, wherein two adjacent light transmitting regions comprise a first light transmitting region and a second light transmitting region, respectively;

the display panel further comprises:

an intermediate region located between the second region surrounding the first light transmitting region and the second surrounding the second light transmitting region;

a third spacer layer arranged to be in a same layer as the first spacer layer and in connection with the first spacer layer, and comprising a first portion and a second portion, wherein the first portion and the second portion are opposed to each other in a direction, which is in a plane parallel to the first substrate, perpendicular to a direction from the first light transmitting region to the second light transmitting region, and the intermediate region is located between the first portion and the second portion;

a plurality of fourth support pillars arranged along the first portion and spaced away from each other, wherein orthographic projections of the plurality of the fourth support pillars on the first substrate are located in an orthographic projection of the first portion on the first substrate;

a plurality of fifth support pillars arranged along the second portion and spaced away from each other, wherein orthographic projections of the plurality of the fifth support pillar on the first substrate are located in the orthographic projections of the second portion on the first substrate; in the direction perpendicular to the first substrate, the plurality of the fourth support pillars, the plurality of the fifth support pillars and the plurality of the second support pillar are disposed in a same layer, and a shape and size of each of the plurality of the fourth support pillars are identical with a shape and size of each of the plurality of the second support pillars.

16. The display panel according to claim 15, further comprising:

a plurality of sixth support pillars located on a side of the first portion adjacent to the intermediate region, arranged along the first portion and spaced away from each other; and a plurality of seven support pillars located on a side of the second portion adjacent to the intermediate region, arranged alone the second portion and spaced away from each other, wherein in the direction perpendicular to the first substrate, the plurality of the sixth support pillars, the plurality of the seven support pillars and the plurality of the first support pillars are disposed in a same layer, a shape and size of each of the plurality of the sixth support pillars and a shape and size of each of the plurality of the seven support pillars are identical with a shape and size of each of the first support pillars.

17. The display panel according to claim 15, wherein the intermediate region is an intermediate display region, the intermediate display region comprises a plurality of intermediate pixels arranged in an array, each of the plurality of the intermediate pixels comprises a plurality of color intermediate sub-pixels, the black matrix defines the color intermediate sub-pixels in the intermediate display region, wherein a light transmittance of the intermediate display region is less than or equal to a light transmittance of the display region.

18. The display panel according to claim 17, wherein the protection layer further covers the intermediate display region;
a thickness of a portion of the protection layer covering the intermediate display region in a direction perpendicular to the first substrate is greater than a thickness of a portion of the protection layer covering the display region in a direction perpendicular to the first substrate.

19. The display panel according to claim 17, further comprising:
a plurality of intermediate spacers located in the intermediate display region and arranged in an array,
wherein an arrangement density of the plurality of the intermediate spacers in the intermediate display region is less than an arrangement density of the plurality of the spacers in the display region.

20. The display panel according to claim 15, wherein the photoelectric sensing region comprises at least three light transmitting regions and an auxiliary functional region, the at least three light transmitting regions and the auxiliary functional region are arranged in a 2×2 matrix, an interval between a first row and a second row of the 2×2 matrix and an interval between a first column and a second column of the 2×2 matrix form a cross region, a structure in the cross region is identical with a structure in the intermediate region.

* * * * *